United States Patent
Kim et al.

(10) Patent No.: US 12,550,554 B2
(45) Date of Patent: Feb. 10, 2026

(54) DISPLAY APPARATUS WITH REDUCED ASYMMETRIC COLOR SHIFT

(71) Applicant: Samsung Display Co., Ltd., Yongin-si (KR)

(72) Inventors: Sunghwan Kim, Yongin-si (KR); Wonkyu Kwak, Yongin-si (KR); Changsoo Pyon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 622 days.

(21) Appl. No.: 17/994,677

(22) Filed: Nov. 28, 2022

(65) Prior Publication Data

US 2023/0217751 A1    Jul. 6, 2023

(30) Foreign Application Priority Data

Dec. 31, 2021 (KR) .................. 10-2021-0194547

(51) Int. Cl.
*H10K 59/131* (2023.01)
*H10K 59/124* (2023.01)

(52) U.S. Cl.
CPC ......... *H10K 59/131* (2023.02); *H10K 59/124* (2023.02)

(58) Field of Classification Search
CPC .................... H10K 59/131; H10K 59/124
See application file for complete search history.

(56) References Cited

U.S. PATENT DOCUMENTS

| | | |
|---|---|---|
| 10,211,271 B2 | 2/2019 | Kim et al. |
| 10,763,316 B2 | 9/2020 | Han et al. |
| 2010/0001988 A1 | 1/2010 | Kim |
| 2016/0204172 A1 | 7/2016 | Park |
| 2017/0005156 A1 | 1/2017 | Kim et al. |
| 2017/0012094 A1* | 1/2017 | Lee ........ H10K 59/131 |
| 2020/0357877 A1* | 11/2020 | Hyun ....... H10K 59/353 |
| 2021/0098546 A1 | 4/2021 | Erickson et al. |
| 2021/0273195 A1 | 9/2021 | Lee et al. |
| 2021/0313410 A1 | 10/2021 | Kim et al. |
| 2021/0359073 A1* | 11/2021 | Cha ......... H10D 86/60 |

FOREIGN PATENT DOCUMENTS

| | | |
|---|---|---|
| EP | 3 293 767 | 3/2018 |
| KR | 10-1462163 | 11/2014 |
| KR | 10-1608332 | 4/2016 |
| KR | 10-2018-0062053 | 6/2018 |
| KR | 10-2019-0078753 | 7/2019 |
| KR | 10-2020-0006647 | 1/2020 |
| KR | 10-2020-0133803 | 11/2020 |

* cited by examiner

*Primary Examiner* — Lex H Malsawma
(74) *Attorney, Agent, or Firm* — F. CHAU & ASSOCIATES, LLC

(57) ABSTRACT

A display apparatus includes a first conductive layer and a first conductive line arranged in a first pixel area; a second conductive layer and a second conductive line arranged in a second pixel area; a first pixel electrode in which a first emission area is defined; a second pixel electrode in which a second emission area is defined. A first hole and a second hole are defined in a first insulating layer. The first conductive layer and the first conductive line electrically contact each other in the first hole. The second conductive layer and the second conductive line electrically contact each other in the second hole. The first emission area overlaps the first hole in a plan view. The second emission area does not overlap the second hole in a plan view.

20 Claims, 23 Drawing Sheets

DISPLAY APPARATUS WITH REDUCED ASYMMETRIC COLOR SHIFT

CROSS-REFERENCE TO RELATED APPLICATION

This application claims priority to and benefits of Korean Patent Application No. 10-2021-0194547 under 35 U.S.C. § 119, filed in the Korean Intellectual Property Office on Dec. 31, 2021, the entire contents of which are incorporated herein by reference.

BACKGROUND

1. Technical Field

One or more embodiments relate to a display apparatus capable of reducing an asymmetric color shift phenomenon and ensuring excellent visibility while minimizing a characteristic difference between pixels.

2. Description of the Related Art

The importance of display apparatuses as communication media, has been emphasized because of the increasing developments of technology and additional benefits including reduced thinness and weight, and low power consumption. The resolution of the display apparatus increases, and a display element, a plurality of transistors for driving the display element, capacitors, and lines for transmitting signals thereto overlap each other in a plan view. Accordingly, various issues may occur.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display apparatus capable of reducing an asymmetric color shift phenomenon and ensuring desired (or excellent) visibility while minimizing a characteristic difference between pixels.

However, embodiments of the disclosure are not limited to those set forth herein. The above and other embodiments will become more apparent to one of ordinary skill in the art to which the description pertains by referencing the detailed description of the disclosure given below.

Additional aspects will be set forth in part in the description that follows and, in part, will be apparent from the description, or may be learned by practice of the embodiments of the disclosure.

According to an embodiment, a display apparatus includes a first conductive layer arranged in a first pixel area, a second conductive layer arranged in a second pixel area that is adjacent to the first pixel area, a first conductive line arranged in the first pixel area and extending in a first direction, a second conductive line arranged in the second pixel area and extending in the first direction, a first pixel electrode in which a first emission area is defined, a second pixel electrode in which a second emission area is defined, and a first insulating layer disposed between the first conductive layer and the first conductive line and between the second conductive layer and the second conductive line. A first hole and a second hole are defined in the first insulating layer. The first conductive layer and the first conductive line electrically contact each other in the first hole. The second conductive layer and the second conductive line electrically contact each other in the second hole. The first emission area overlaps the first hole in a plan view. The second emission area does not overlap the second hole in a plan view.

The first hole may be located at a center of the first emission area.

A dummy hole that is spaced apart from the second hole may be further defined in the first insulating layer, and the second emission area may overlap the dummy hole in a plan view.

The dummy hole may be located at a center of the second emission area.

The first hole and the second hole may be arranged in a zigzag in a second direction perpendicular to the first direction.

The display apparatus may further include a first semiconductor layer arranged in the first pixel area, a second semiconductor layer arranged in the second pixel area, and a second insulating layer which is arranged between the first semiconductor layer and the first conductive layer and between the second semiconductor layer and the second conductive layer, and arranged under the first insulating layer. A third hole and a fourth hole may be defined in the second insulating layer. The first semiconductor layer and the first conductive layer may be in contact with each other in the third hole. The second semiconductor layer and the second conductive layer may be in contact with each other in the fourth hole. The third hole may not overlap the first hole, and the fourth hole overlaps the second hole in a plan view.

The first emission area may overlap the third hole in a plan view, and the second emission area may not overlap the fourth hole in a plan view.

A first dummy hole that is spaced apart from the first hole may be further defined in the first insulating layer, and the first hole and the first dummy hole may be symmetrical to each other in the first direction with respect to a center of the first emission area, and the first hole and the first dummy hole may overlap the first emission area in a plan view.

A center of the first hole and a center of the second hole may be located on a virtual straight line in a second direction perpendicular to the first direction.

A second dummy hole that is spaced apart from the second hole may be further defined in the first insulating layer, and the second dummy hole may be located at a center of the second emission area.

According to an embodiment, a display apparatus includes first conductive layer arranged in a first pixel area, a second conductive layer arranged in a second pixel area that is adjacent to the first pixel area, a first conductive line disposed on the first conductive layer of the first pixel area, a second conductive line disposed on the second conductive layer of the second pixel area, a first pixel electrode disposed on the first conductive line, a second pixel electrode disposed on the second conductive line, and a pixel-defining layer which covers an edge of the first pixel electrode and the second pixel electrode, and in which a first opening and a second opening area defined. The first opening may correspond to a portion of the first pixel electrode and the second opening may correspond to a portion of the second pixel electrode. The first opening may overlap in a plan view a location at which the first conductive layer and the first conductive line are in contact with each other. The second opening does may overlap in a plan view a location at which the second conductive layer and the second conductive line electrically contact each other.

The display apparatus may further include a first insulating layer disposed between the first conductive layer and the first conductive line and between the second conductive layer and the second conductive line. A first hole and a second hole may be defined in the first insulating layer in which the first conductive layer and the first conductive line electrically contact each other in the first hole. The second conductive layer and the second conductive line may electrically contact each other in the second hole. The first hole may be located at a center of the first opening. The second hole may be located adjacent to the second pixel electrode.

A dummy hole that is spaced apart from the second hole may be further defined in the first insulating layer, and the dummy hole may overlap a center of the second opening in a plan view.

The dummy hole may be located at the center of the second opening.

The first hole and the second hole may be arranged in a zigzag in a direction perpendicular to a direction in which the first conductive line extends.

The display apparatus may further include a first insulating layer disposed between the first conductive layer and the first conductive line and between the second conductive layer and the second conductive line. A first hole, a second hole, and a first dummy hole may be defined in the first insulating layer. The first conductive layer and the first conductive line may electrically contact each other in the first hole. The second conductive layer and the second conductive line may electrically contact each other in the second hole. The first dummy hole may be spaced apart from the first hole. The first hole and the first dummy hole may be symmetrical to each other in a direction in which the first conductive line extends with respect to a center of the first opening. The first hole and the first dummy hole may overlap the first opening in a plan view.

Centers of the first hole and the second hole may be located on a virtual straight line in a direction perpendicular to the extension direction of the first conductive line.

A second dummy hole that is spaced apart from the second hole may be further defined in the first insulating layer, and the second dummy hole may be located at a center of the second opening.

The display apparatus may further include a first semiconductor layer arranged in the first pixel area, a second conductive layer arranged in the second pixel area, and a first insulating layer disposed between the first conductive layer and the first conductive line and between the second conductive layer and the second conductive line, and a second insulating layer which is arranged between the first semiconductor layer and the first conductive layer and between the second semiconductor layer and the second conductive layer, and arranged under the first insulating layer. A first hole and a second hole may be defined in the first insulating layer. The first conductive layer and the first conductive line may electrically contact each other in the first hole. The second conductive layer and the second conductive line may electrically contact each other in the second hole. A third hole and a fourth hole may be defined in the second insulating layer in which the first semiconductor layer and the first conductive layer electrically contact each other in the third hole. The second semiconductor layer and the second conductive layer may electrically contact each other in the fourth hole. The third hole may not overlap the first hole in a plan view. The fourth hole may overlap the second hole in a plan view.

The first opening may overlap the first hole and the third hole in a plan view, and the second opening may not overlap the second hole and the fourth hole in a plan view.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
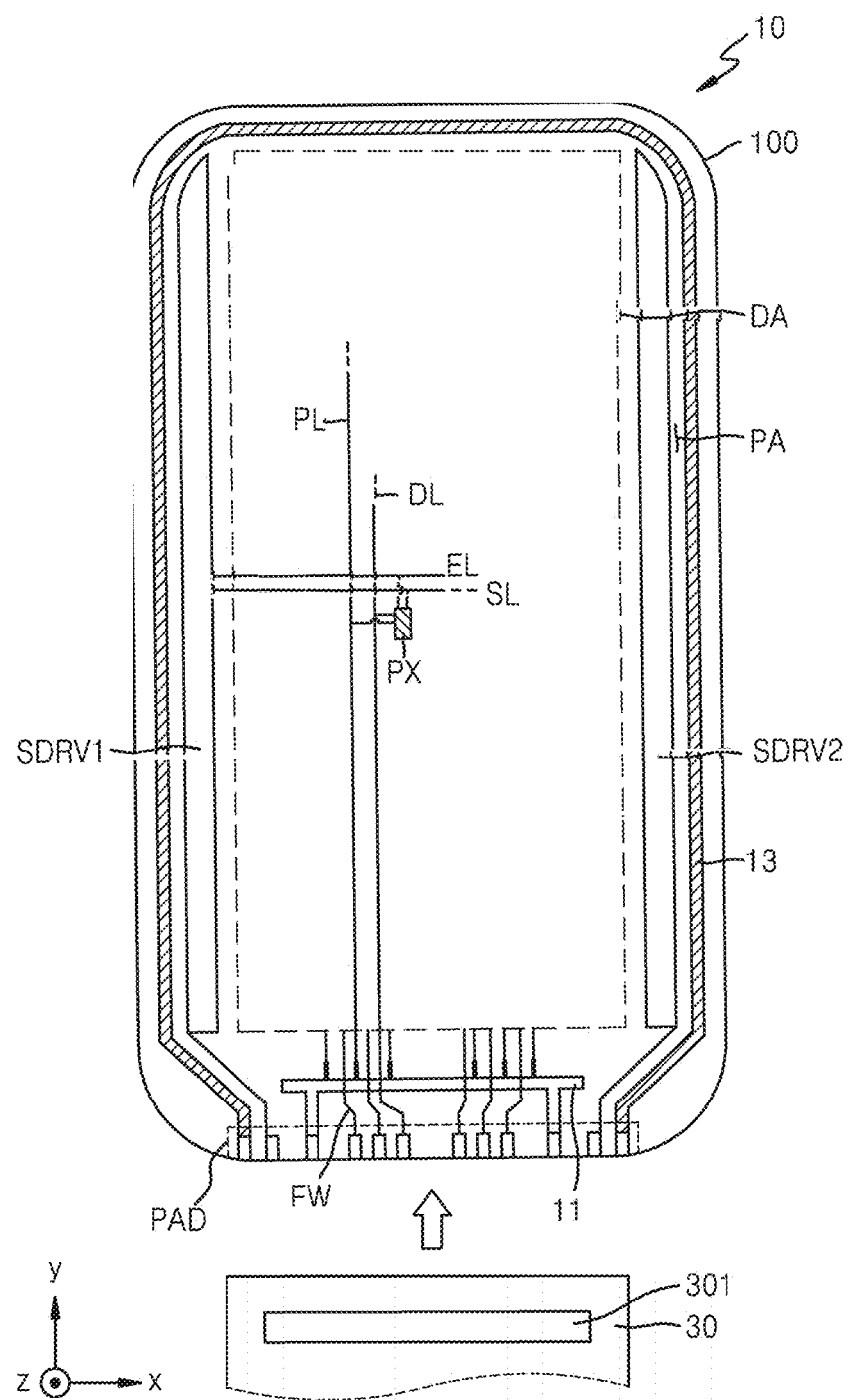
FIG. 1 is a schematic plan view schematically illustrating a display panel according to an embodiment.

In the following description, for the purpose of explanation, numerous specific details are set forth in order to provide understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing exemplary features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

Throughout the disclosure, the phrase "at least one of" is intended to include the meaning of "at least one selected from the group of" for the purpose of its meaning and interpretation. For example, "at least one of A and B" may be understood to mean "A, B, or A and B".

As customary in the field, some embodiments are described an illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

In the accompanying drawings, like reference numerals denote like elements, and the redundant descriptions thereof are omitted.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

The terminology used herein is for the purpose of describing particular elements and is not intended to be limiting. As used herein, the singular forms, "a," "an," and "the" are intended to include the plural forms as well, unless the context clearly indicates otherwise.

Moreover, the terms "comprise," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

When an element, such as a layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes.

When an embodiment may be implemented differently, a specific process order may be performed differently from the described order. For example, two consecutively described processes may be performed substantially at the same time or performed in an order opposite to the described order.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the following embodiments, the phrase "in a plan view" means an object portion is viewed from above, and the phrase "in a cross-sectional view" means when a cross-section taken by vertically cutting an object portion is viewed from the side. In the following embodiments, that a first element "overlaps" a second element means that the first elements is disposed over or under the second element.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a schematic plan view schematically illustrating a display panel according to an embodiment.

Referring to FIG. 1, a display apparatus according to an embodiment may include a display panel 10. The display panel 10 may include a display area DA and a peripheral area PA. Various elements included in the display panel 10 may be disposed on (or disposed over) a substrate 100. The substrate 100 may include the display area DA and the peripheral area PA.

In a plan view, the display area DA may have a rectangular shape as in FIG. 1. In another embodiment, the display area DA may have a polygonal shape, such as a triangular shape, a pentagonal shape, and a hexagonal shape, a circular shape, an elliptical shape, an amorphous shape, or the like. The display area DA may have round corners. The peripheral area PA may be a kind of a non-display area in which display elements are not arranged. The display area DA may be surrounded (e.g., entirely surrounded) by the peripheral area PA.

Pixels PX having various display elements, such as an organic light-emitting diode, may be arranged in the display area DA. Multiple pixels PX may be provided in the display area DA, and the pixels PX may be arranged in various arrangements, such as a stripe arrangement, a PENTILE® arrangement, a delta arrangement and a mosaic arrangement, in an x direction and a y direction to generate an image. For example, each of the pixels PX may emit red, green, blue, or white light.

Each of pixel circuits for driving the pixels PX may be electrically connected to outer circuits arranged in the peripheral area PA. A first scan driving circuit SDRV1, a second scan driving circuit SDRV2, a terminal part PAD, a driving voltage supply line 11, and a common voltage supply line 13 may be arranged in the peripheral area PA.

The first scan driving circuit SDRV1 may apply a scan signal to each of the pixel circuits for driving the pixels PX, via a scan line SL. The first scan driving circuit SDRV1 may apply an emission control signal to each of the pixel circuits via an emission control line EL. The second scan driving circuit SDRV2 may be located at an opposite side to the first scan driving circuit SDRV1 with respect to the display area DA, and may be approximately parallel to the first scan driving circuit SDRV1. Some of the pixel circuits of the pixels PX of the display area DA may be electrically connected to the first scan driving circuit SDRV1, and another some of the pixel circuits of the pixels PX of the display area DA may be electrically connected to the second scan driving circuit SDRV2. The second scan driving circuit SDRV2 may be omitted.

The terminal part PAD may be arranged at a side of the substrate 100. The terminal part PAD may not be covered by an insulating layer but exposed, and connected to a display circuit board 30. A display driving part 301 may be disposed on the display circuit board 30.

The display driving part 301 may generate a control signal, and the control signal may be transmitted to the first scan driving circuit SDRV1 and the second scan driving circuit SDRV2. The display driving part 301 may generate a data signal, and the generated data signal may be transmitted to the pixel circuits of the pixels PX via a fan-out line FW and a data line DL electrically connected to the fan-out line FW.

The display driving part 301 may apply a driving voltage ELVDD to the driving voltage supply line 11 and apply a common voltage ELVSS to the common voltage supply line 13. The driving voltage ELVDD may be applied to the pixel circuits of the pixels PX via a driving voltage line PL that is electrically connected to the driving voltage supply line 11. The common voltage ELVSS may be applied to an opposite electrode of a display element via the common voltage supply line 13.

The driving voltage supply line 11 may be electrically connected to the terminal part PAD and extend in the x direction under the display area DA. The common voltage supply line 13 may be electrically connected to the terminal part PAD and have a loop shape with a side open to partially surround the display area DA.

The display apparatus may further include a cover window (not shown). The cover window may be disposed on the display panel 10. The cover window may protect the display panel 10. In an embodiment, the cover window may include a flexible window. The cover window may include glass, sapphire, or plastic. For example, the cover window may be ultra-thin glass or colorless polyimide. The cover window may be attached to the display panel 10 by a transparent adhesive member, such as an optically clear adhesive (OCA) film.

The display apparatus according to an embodiment of the disclosure may be implemented as an electronic apparatus, such as smartphones, mobile phones, navigation devices, game machines, televisions (TVs), head devices for vehicle, laptop computers, tablet computers, personal media players (PMPs), personal digital assistants (PDAs), or the like. The electronic apparatus may include a flexible apparatus.

Figure 2:
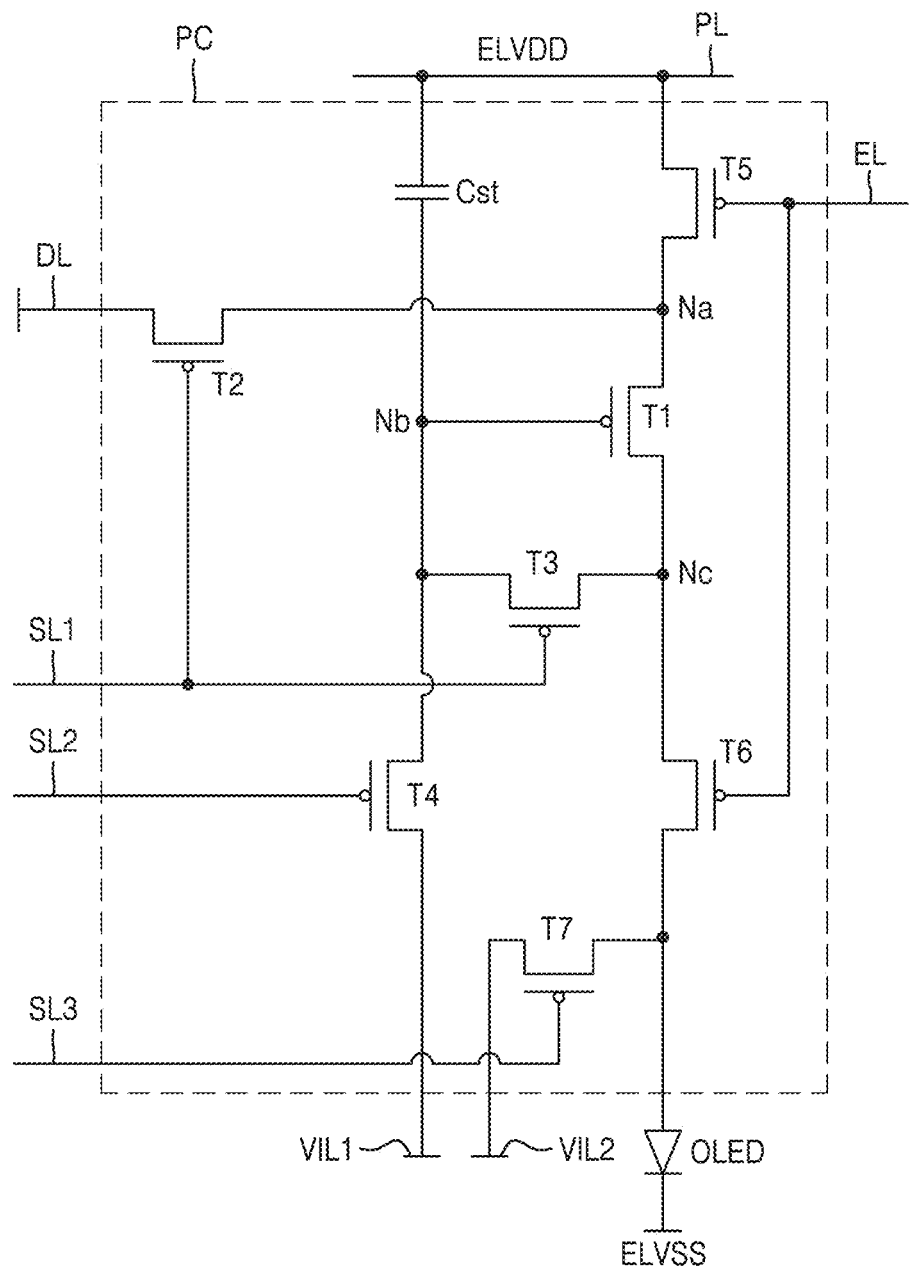
FIG. 2 is a schematic diagram of an equivalent circuit of a pixel that may be included in a display apparatus, according to an embodiment.

FIG. 2 is a schematic diagram of an equivalent circuit diagram of a pixel that may be included in a display apparatus, according to an embodiment.

Referring to FIG. 2, a pixel PX may include a pixel circuit PC and an organic light-emitting diode OLED electrically connected to the pixel circuit PC.

The pixel circuit PC may include a first transistor T1 that is a driving transistor, and second to seventh transistors T2 to T7 that are switching transistors. According to a type (e.g., p-type or n-type) and/or operation condition of a transistor, a first terminal of each of the first to seventh transistors T1 to T7 may include a source terminal or a drain terminal, and a second terminal of each of the first to seventh transistors T1 to T7 may include a terminal different from the first terminal. For example, in case that the first terminal is a source terminal, the second terminal may be a drain terminal. In an embodiment, a source terminal and a drain terminal may be interchangeably used with a source electrode and a drain electrode, respectively.

The pixel circuit PC may be electrically connected to a first scan line SL1 configured to transmit a first scan signal, a second scan line SL2 configured to transmit a second scan signal, a third scan line SL3 configured to transmit a third scan signal, an emission control line EL configured to transmit an emission control signal, the data line DL configured to transmit a data signal, the driving voltage line PL configured to transmit the driving voltage ELVDD, a first initialization voltage line VIL1, and a second initialization voltage line VIL2. The first initialization voltage line VIL1 and the second initialization voltage line VIL2 may be configured to transmit an initialization voltage.

The first transistor T1 may be electrically connected between the driving voltage line PL and the organic light-emitting diode OLED. The first transistor T1 may be electrically connected to the driving voltage line PL via the fifth transistor T5, and may be electrically connected to the organic light-emitting diode OLED via the sixth transistor T6. The first transistor T1 may include a gate terminal electrically connected to a second node Nb, a first terminal electrically connected to a first node Na, and a second terminal electrically connected to a third node Nc. The first transistor T1 may receive a data signal according to a switching operation of the second transistor T2 and supply a driving current to the organic light-emitting diode OLED.

The second transistor T2 (or data write transistor) may be electrically connected between the data line DL and the first node Na, and may be electrically connected to the driving voltage line PL via the fifth transistor T5. The first node Na may be a node to which the first transistor T1 and the fifth transistor T5 are electrically connected. The second transistor T2 may include a gate terminal electrically connected to the first scan line SL1, a first terminal electrically connected to the data line DL, and a second terminal electrically connected to the first node Na (or the first terminal of the first transistor T1). The second transistor T2 may be turned on according to a first scan signal received via the first scan line SL1 and perform a switching operation for transmitting a data signal received via the data line DL to the first node Na.

The third transistor T3 (or compensation transistor) may be electrically connected between the second node Nb and the third node Nc. The third transistor T3 may be electrically connected to the organic light-emitting diode OLED via the sixth transistor T6. The second node Nb may be a node electrically connected to the gate terminal of the first transistor T1. The third node Nc may be a node to which the first transistor T1 and the sixth transistor T6 are electrically connected. The third transistor T3 may include a gate terminal electrically connected to the first scan line SL1, a first terminal electrically connected to the second node Nb (or the gate terminal of the first transistor T1), and a second terminal electrically connected to the third node Nc (or the second terminal of the first transistor T1). The third transistor T3 may be turned on according to a first scan signal received via the first scan line SL1 and diode-connect the first transistor T1. Thus, a threshold voltage of the first transistor T1 may be compensated.

The fourth transistor T4 (or first initialization transistor) may be electrically connected between the second node Nb and the first initialization voltage line VIL1. The fourth transistor T4 may include a gate terminal electrically connected to the second scan line SL2, a first terminal electrically connected to the second node Nb, and a second terminal electrically connected to the first initialization voltage line VIL1. The fourth transistor T4 may be turned on according to a second scan signal received via the second scan line SL2 and transmit an initialization voltage to the gate terminal of the first transistor T1 to initialize the gate voltage of the first transistor T1.

The fifth transistor T5 (or first emission control transistor) may be electrically connected between the driving voltage line PL and the first node Na. The sixth transistor T6 (or second emission control transistor) may be electrically connected between the third node Nc and the organic light-emitting diode OLED. The fifth transistor T5 may include a gate terminal electrically connected to the emission control line EL, a first terminal electrically connected to the driving voltage line PL, and a second terminal electrically connected to the first node Na. The sixth transistor T6 may include a gate terminal electrically connected to the emission control line EL, a first terminal connected to the third node Nc, and a second terminal electrically connected to a pixel electrode of the organic light-emitting diode OLED. The fifth transistor T5 and the sixth transistor T6 may be turned on (e.g., simultaneously turned on) according to an emission control signal received via the emission control line EL, and a driving current may flow in the organic light-emitting diode OLED.

The seventh transistor T7 (or second initialization transistor) may be electrically connected between the organic light-emitting diode OLED and the second initialization voltage line VIL2. The seventh transistor T7 may include a gate terminal electrically connected to the third scan line SL3, a first terminal electrically connected to the second terminal of the sixth transistor T6 and the pixel electrode of the organic light-emitting diode OLED, and a second terminal electrically connected to the second initialization voltage line VIL2. The seventh transistor T7 may be turned on according to a third scan signal received via the third scan line SL3 and transmit an initialization voltage to the pixel electrode of the organic light-emitting diode OLED to initialize a voltage of the pixel electrode of the organic light-emitting diode OLED. An initialization voltage applied via the second initialization voltage line VIL2 and an initialization voltage applied via the first initialization voltage line VIL1 may be different from each other. In an embodiment, the third scan line SL3 may be the second scan line SL2 of a next row, and the third scan signal may be a second scan signal of a next row. The seventh transistor T7 may be omitted.

A capacitor Cst may include a first electrode electrically connected to the second node Nb and a second electrode electrically connected to the driving voltage line PL. The capacitor Cst may store and maintain a voltage corresponding to a voltage difference between voltages respectively applied to both ends of the first electrode and the second electrode. Thus, a voltage applied to the gate terminal of the first transistor T1 may maintain.

The organic light-emitting diode OLED may include a pixel electrode (e.g., an anode) and an opposite electrode (e.g., a cathode) facing the pixel electrode, and the opposite electrode may receive the common voltage ELVSS. The organic light-emitting diode OLED may receive, from the first transistor T1, a driving current corresponding to a voltage stored in the capacitor Cst and emit light of a color to display an image.

In FIG. 2, transistors of a pixel circuit may be shown as p-type transistors. However, embodiments are not limited thereto, and various modifications may be made. For example, the transistors of the pixel circuit may be n-type transistors. In some embodiments, some of the transistors of the pixel circuit may be p-type transistors, and other ones may be n-type transistors.

In FIG. 2, each of the third transistor T3 and the fourth transistor T4 may have one gate terminal. In another embodiment, each of the third transistor T3 and the fourth transistor T4 may have two gate terminals electrically connected to each other in series.

Figure 3:
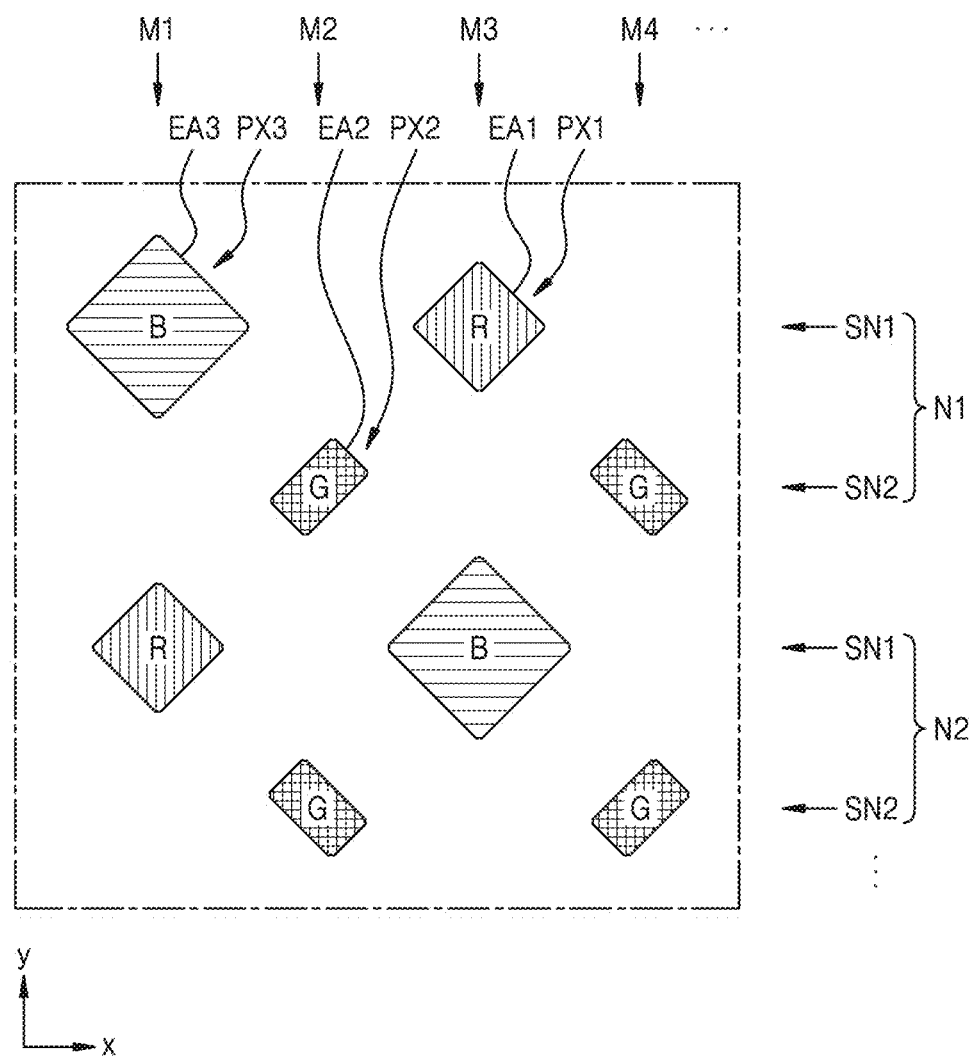
FIG. 3 is a schematic layout diagram illustrating emission areas of pixels according to an embodiment.

FIG. 3 is a schematic layout diagram illustrating emission areas of pixels according to an embodiment.

Referring to FIG. 3, the pixels arranged in the display area DA may include a first pixel PX1, a second pixel PX2, and a third pixel PX3. The first pixel PX1, the second pixel PX2, and the third pixel PX3 may be repeatedly arranged in the x direction and the y direction according to a pattern. Each of the first pixel PX1, the second pixel PX2, and the third pixel PX3 may include a pixel circuit and an organic light-emitting diode OLED electrically connected to the pixel circuit. The organic light-emitting diode OLED included in each of the pixels may be disposed on an upper layer of the pixel circuit. The organic light-emitting diode OLED may be disposed directly on (or directly over) the pixel circuit to overlap the pixel circuit in a plan view, or may be offset from the pixel circuit to partially overlap in a plan view a pixel circuit of another pixel arranged in an adjacent row or column.

FIG. 3 shows an emission area of each of the first pixel PX1, the second pixel PX2, and the third pixel PX3. The emission area may include an area in which an emission layer of the organic light-emitting diode OLED is arranged. The emission area may be defined by an opening of a pixel-defining layer. Description of the emission area is provided below.

The first pixel PX1 may include a first emission area EA1. The second pixel PX2 may include a second emission area EA2. The third pixel PX3 may include a third emission area EA3.

In odd-numbered columns (or even-numbered columns), the first emission area EA1 of the first pixel PX1 and the third emission area EA3 of the third pixel PX3 may be alternately arranged with each other in the y direction. In even-numbered columns (or odd-numbered columns), the second emission area EA2 of the second pixel PX2 may be repeatedly arranged in the y direction. In a first column M1, the third emission area EA3 of the third pixel PX3 and the first emission area EA1 of the first pixel PX1 may be alternately arranged with each other in the y direction. In a second column M2 adjacent to the first column M1, the second emission area EA2 of the second pixel PX2 may be repeatedly arranged in the y direction. In a third column M3 adjacent to the second column M2, the first emission area EA1 of the first pixel PX1 and the third emission area EA3 of the third pixel PX3 may be alternately arranged with each other in the y direction, opposite to the first column M1.

In a first sub-row SN1 of each of the rows N1, N2, etc., the first emission area EA1 of the first pixel PX1 and the third emission area EA3 of the third pixel PX3 may be alternately arranged with each other in the x direction. In a second sub-row SN2 of each of the rows N1, N2, etc., the second emission area EA2 of the second pixel PX2 may be repeatedly arranged in the x direction. In each of the rows N1, N2, etc., the first emission area EA1 of the first pixel PX1, the second emission area EA2 of the second pixel PX2, the third emission area EA3 of the third pixel PX3, and the second emission area EA2 of the second pixel PX2 may be repeatedly arranged in zigzag.

The first emission area EA1 of the first pixel PX1, the second emission area EA2 of the second pixel PX2, and the third emission area EA3 of the third pixel PX3 may have different areas from each other. In an embodiment, the third emission area EA3 of the third pixel PX3 may have an area greater than that of the first emission area EA1 of the first pixel PX1. The third emission area EA3 of the third pixel PX3 may have an area greater than that of the second emission area EA2 of the second pixel PX2. The first emission area EA1 of the first pixel PX1 may have an area greater than that of the second emission area EA2 of the second pixel PX2. In another embodiment, the third emission area EA3 of the third pixel PX3 may have a same area as the first emission area EA1 of the first pixel PX1. However, the disclosure is not limited thereto. For example, the first emission area EA1 of the first pixel PX1 may be greater in size than the second emission area EA2 of the second pixel PX2 and the third emission area EA3 of the third pixel PX3, and various modifications may be made.

The first to third emission areas EA1, EA2, and EA3 may each have a polygonal shape, such as a quadrangle and an octagon, a circular shape, an elliptical shape, or the like, and the polygonal shape may include a shape with round corners (or vertices).

In an embodiment, the first pixel PX1 may be a red pixel R emitting red light. The second pixel PX2 may be a green pixel G emitting green light. The third pixel PX3 may be a blue pixel B emitting blue light. In another embodiment, the first pixel PX1 may be a red pixel R, the second pixel PX2 may be a blue pixel B, and the third pixel PX3 may be a green pixel G.

In an embodiment of the disclosure, an arrangement of pixels may be understood as an arrangement of emission areas. The pixel arrangement according to an embodiment of the disclosure is not limited to the arrangement described above. For example, the disclosure is applicable to a pixel arrangement having a stripe arrangement, a PENTILE® arrangement, delta arrangement or a mosaic arrangement. The disclosure is applicable to a pixel arrangement structure that further includes a white pixel emitting white light.

Figure 4:
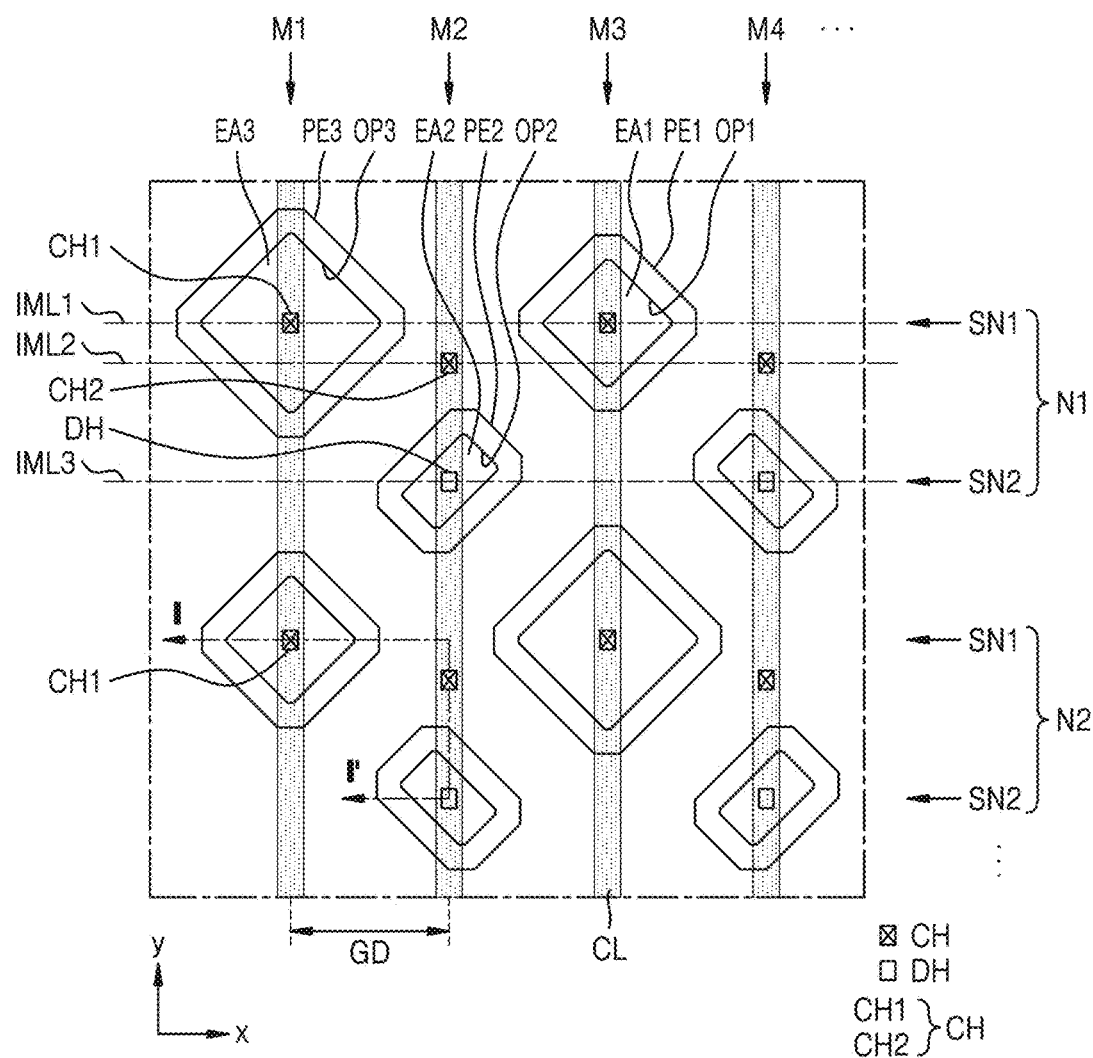
FIG. 4 is a schematic layout diagram showing a relationship between an emission area and a conductive layer of a pixel according to an embodiment.
Figure 5:
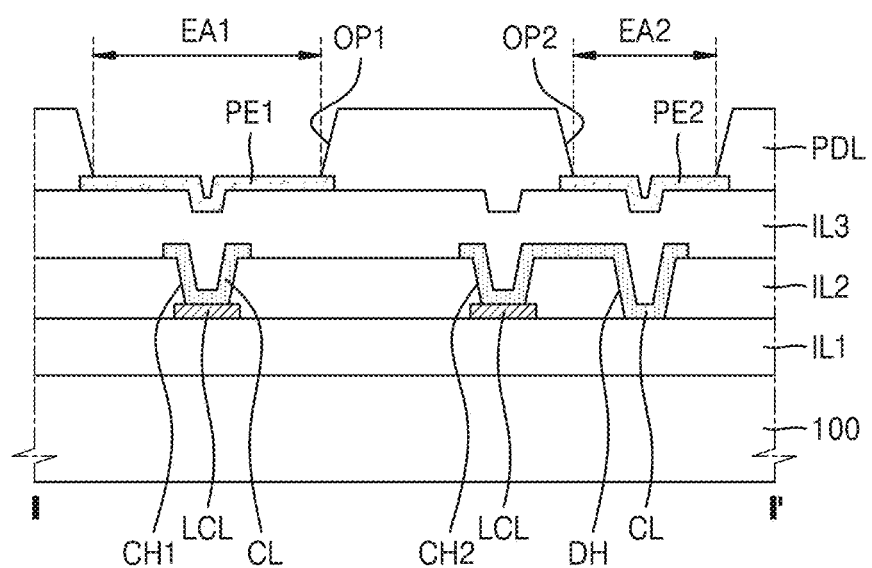
FIG. 5 is a schematic cross-sectional view of the pixel taken along line I-I' of FIG. 4.

FIG. 4 is a schematic layout diagram showing a relationship between an emission area and a conductive layer of a pixel according to an embodiment. FIG. 5 is a schematic cross-sectional view of the pixel taken along line I-I' of FIG. 4.

Referring to FIGS. 3 to 5, conductive lines CL electrically connected to pixels PX may be arranged in the display area DA of the substrate 100. Each of the conductive lines CL may extend in the y direction and be electrically connected to pixels arranged in a same column. For example, the conductive line CL extending along the first column M1 may be electrically connected to the first pixels PX1 and the third pixels PX3 that are alternately arranged with each other. The conductive line CL extending along the second column M2 may be electrically connected to the second pixels PX2. Each of the conductive lines CL may be arranged to overlap (e.g., partially overlap) emission areas of the pixels in a plan view. The conductive lines CL may include lines configured to transmit a signal to the pixels PX. For example, the conductive lines CL may include a data line configured to transmit a data signal to the pixels PX. The conductive lines CL may be arranged for each column, and may be apart (or spaced apart) from each other in the x direction at intervals (e.g., certain or selected intervals). The conductive lines CL may respectively contact (or may be respectively in contact (e.g., electrical and physical contact) with) lower conductive layers LCL via contact holes CH. The contact holes CH may be defined in an insulating layer IL2 between the conductive line CL and the lower conductive layer LCL. Although not shown, circuit elements included in the pixel circuit may be arranged in a multi-layered insulating layer IL1 between the substrate 100 and the lower conductive layer LCL. The lower conductive layer LCL may be in contact (e.g., electrical and physical contact) with an element of the pixel circuit. The lower conductive layer LCL may be referred to as a lower conductive line LCL An insulating layer IL3 may be disposed on the conductive line CL, and first to third pixel electrodes PE1, PE2, and PE3 of the first to third pixels PX1, PX2, and PX3 may be disposed on the insulating layer IL3.

The first pixel electrode PE1 of the first pixel PX1 and the third pixel electrode PE3 of the third pixel PX3 may be alternately arranged with each other in the x direction and the y direction. The first pixel electrode PE1 of the first pixel PX1 and the third pixel electrode PE3 of the third pixel PX3 may be alternately arranged with each other in the y direction in odd-numbered columns (e.g., M1, M3, etc.), and may be alternately arranged with each other in the x direction in the first sub row SN1. The second pixel electrode PE2 of the second pixel PX2 may be apart from the first pixel electrode PE1 and the third pixel electrode PE3 in a diagonal direction, and may be repeatedly arranged in the x direction and the y direction. The second pixel electrode PE2 of the second pixel PX2 may be repeatedly arranged in the y direction in even-numbered columns (e.g., M2, M4, etc.), and may be repeatedly arranged in the x direction in the second sub-row SN2 of each of the rows N1, N2, etc.

The first to third emission areas EA1, EA2, and EA3 of the first to third pixels PX1, PX2, and PX3 may be areas corresponding to part of first to third pixel electrodes PE1, PE2, and PE3, respectively. The first to third emission areas EA1, EA2, and EA3 may be defined by first to third openings OP1, OP2, and OP3 defined in a pixel-defining layer PDL.

The conductive line CL may overlap the contact holes CH in a plan view, and the contact holes CH may be arranged in the y direction along the conductive line CL. The contact holes CH may include first contact holes CH1 and second contact holes CH2. The first contact holes CH1 may overlap the first emission areas EA1 of the first pixels PX1 and the third emission areas EA3 of the third pixels PX3 in a plan view. The second contact holes CH2 may not overlap the second emission areas EA2 of the second pixels PX2 in a plan view. For example, the first contact holes CH1 arranged along the first column M1 may overlap the first emission area EA1 of the first pixel PX1 and the third emission area EA3 of the third pixel PX3 in a plan view. The second contact holes CH2 arranged along the second column M2 may be arranged adjacent to the second emission area EA2 of the second pixel PX2. The first contact holes CH1 may be arranged at centers of the first emission areas EA1 and the third emission areas EA3.

Dummy holes DH may be further defined in the insulating layer IL2. The dummy holes DH may overlap the conductive line CL extending along the second column M2 in a plan view. The dummy holes DH may overlap the second emission areas EA2 of the second pixels PX2 in a plan view. The dummy holes DH may be arranged at centers of the second emission areas EA2.

Each of the first emission area EA1 and the third emission area EA3 may be vertically and horizontally symmetrical with respect to a first contact hole CH1. The second emission area EA2 may be vertically and horizontally symmetrical with respect to the dummy hole DH. For example, each of the first emission area EA1 and the third emission area EA3 may be vertically symmetrical to each other with respect to a virtual straight line that passes through a center of the first contact hole CH1 in the y direction, and may be horizontally symmetrical to each other with respect to a virtual straight line that passes through the center of the first contact hole CH1 in the x direction. The second emission area EA2 may be symmetrical with respect to a virtual straight line that passes through a center of the dummy hole DH in a diagonal direction (e.g., a direction inclined from a +y direction to a +x direction), and may be symmetrical with respect to a virtual straight line that passes through the center of the dummy hole DH in a diagonal direction (e.g., a direction inclined from a +y direction to a −x direction).

In a plan view, in the x direction, a virtual straight line IML1 passing through the centers of the first contact holes CH1 that overlap the centers of the first emission areas EA1 and the third emission areas EA3, a virtual straight line IML2 passing through the centers of the second contact holes CH2, and a virtual straight line IML3 passing through the centers of the dummy holes DH that overlap the centers of the second emission areas EA2 in a plan view may be parallel to scan lines with a distance (e.g., constant interval) from each other.

In a plan view, in the x direction, the first contact holes CH1 and the second contact holes CH2 may be alternately arranged with each other in zigzag at a column spacing GD. In the x direction, the first contact holes CH1 and the dummy holes DH may be alternately arranged with each other in zigzag at the column spacing GD.

In a plan view, in the y direction, the first contact holes CH1 may be apart from each other by a distance between centers of a pair of pixel electrodes (e.g., first pixel electrode PE1 and third pixel electrode PE3). The second contact holes CH2 and the dummy hole DH may be alternately arranged with each other at a distance between a position disposed between the pair of pixel electrodes and a center of a pixel electrode.

In an embodiment, the dummy hole DH may have a same size as the contact hole CH. In another embodiment, the size of the dummy hole DH may be less than or greater than the size of the contact hole CH. The size of the dummy hole DH may be determined based on the first emission area EA1. For example, the size of the dummy hole DH may be determined so that a ratio of an area of the first contact hole CH1 to an area of the first emission area EA1 is a same as a ratio of an area of the dummy hole DH to an area of the second emission area EA2. For example, the size of the dummy hole DH may be smaller than the size of the first contact hole CH1 in case that the area of the second emission area EA2 is smaller than the area of the first emission area EA1. In some embodiments, the size of the dummy hole DH may be determined based on the third emission area EA3. For example, the size of the dummy hole DH may be determined so that a ratio of the area of the first contact hole CH1 to an area of the third emission area EA3 is a same as a ratio of the area of the dummy hole DH to the area of the second emission area EA2. For example, the size of the dummy hole DH may be smaller than the size of the first contact hole CH1 in case that the area of the second emission area EA2 is smaller than the area of the third emission area EA3. In some embodiments, the size of the dummy hole DH may be determined as a median value of the size of the dummy hole DH determined based on the first emission area EA1 and the size of the dummy hole DH determined based on the third emission area EA3. For example, the ratio of the size of the dummy hole DH to the second emission area EA2 may be the median value between the ratio of the first contact hole CH1 to the area of the first emission area EA1 and the ratio of the first contact hole CH1 to the area of the third emission area EA3.

In case that the first contact holes CH1 and the dummy holes DH are arranged to correspond to the centers of the first to third emission areas EA1 to EA3, step characteristics (e.g., a step or height difference) of the first emission areas EA1, the second emission area EA2, and the third emission areas EA3 may become identical to each other. Thus, asymmetrical color shift between the pixels PX1, PX2, and PX3 according to a viewing angle may be minimized.

Figure 6:
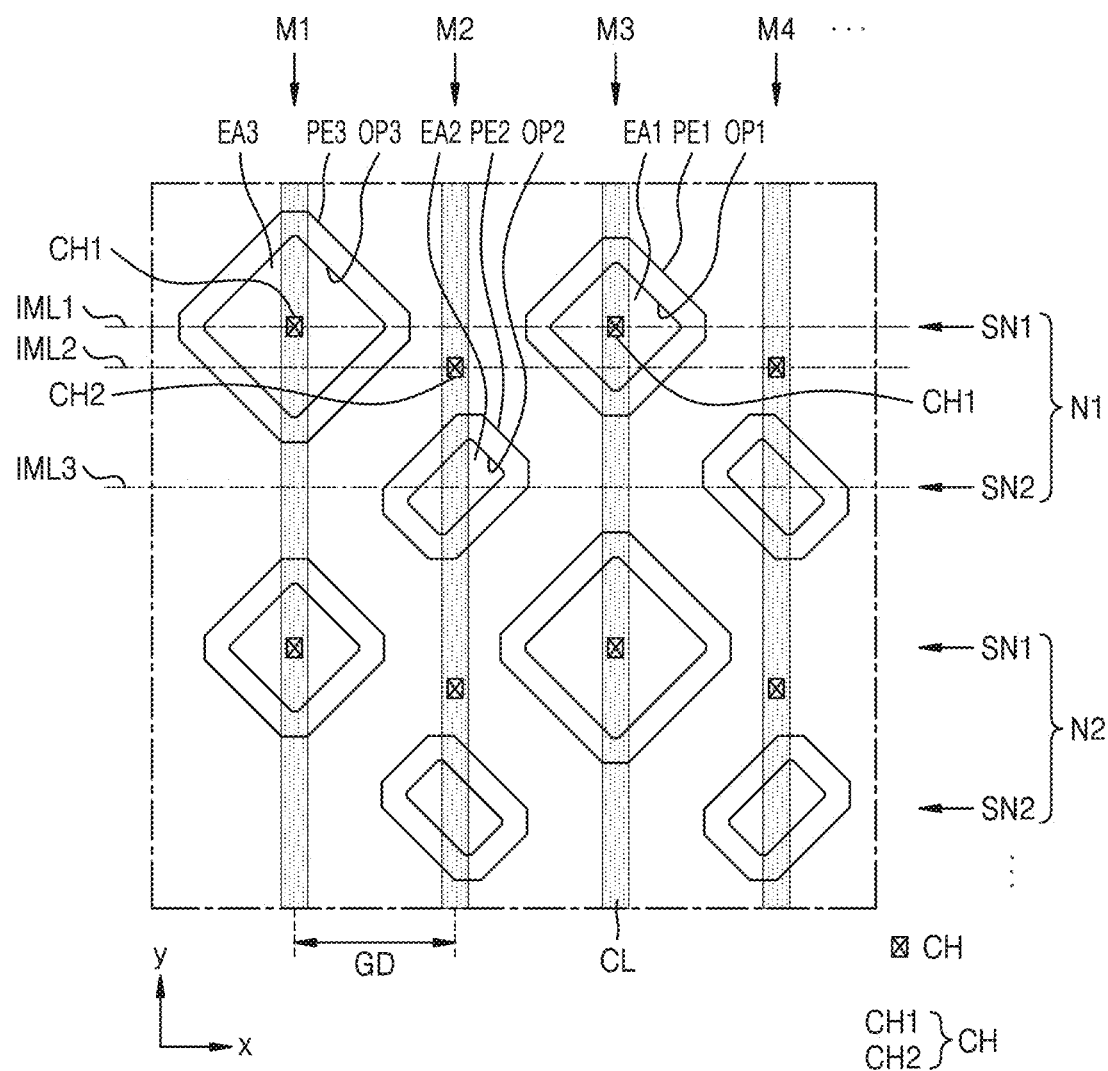
FIG. 6 is a schematic layout diagram showing a relationship between an emission area and a conductive layer of a pixel according to an embodiment.

FIG. 6 is a schematic layout diagram showing a relationship between an emission area and a conductive layer of a pixel according to an embodiment. The embodiment shown in FIG. 6 differs from the embodiment shown in FIG. 4 at least in that the dummy hole DH overlapping each of the second emission areas EA2 of the second pixels PX2 in a plan view is not provided.

Referring to FIG. 6, first emission areas EA1 of a first pixels PX1 and a third emission areas EA3 of a third pixels PX3 may be arranged along a same column (e.g., a first column M1, third column M3, or the like), and a first contact hole CH1 may be positioned at each of the centers of the first emission areas EA1 and the third emission areas EA3. The dummy hole DH may not be provided in each of the second emission areas EA2 of the second pixels PX2. In the display apparatus according to the embodiment shown in FIG. 6, the first emission areas EA1 and the third emission areas EA3 may have the same color shift characteristics, but color shift characteristics of the second emission area EA2 may be different from color shift characteristics of the embodiment shown in FIG. 4.

Figure 7:
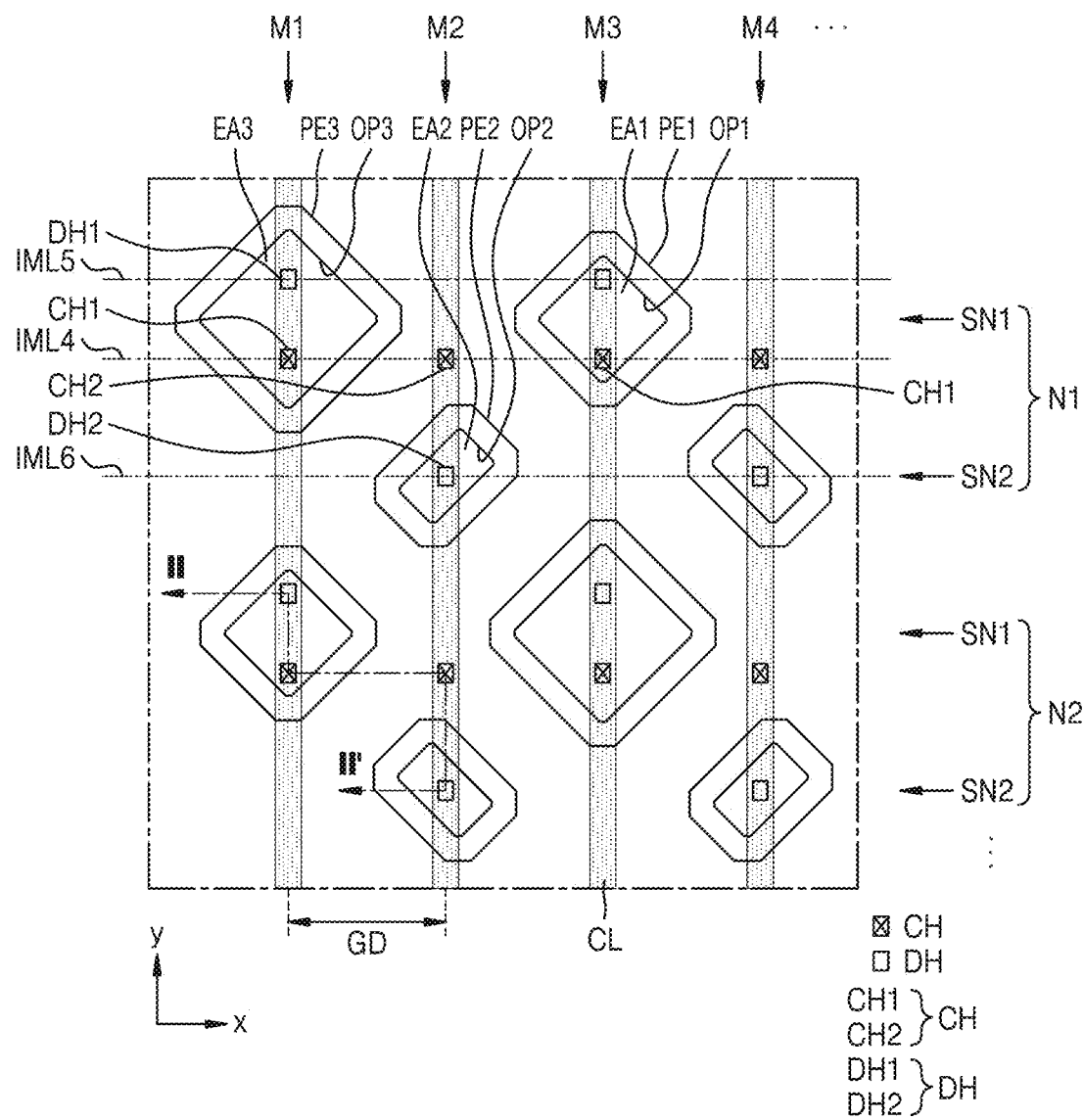
FIG. 7 is a schematic layout diagram showing a relationship between an emission area and a conductive layer of a pixel according to an embodiment.
Figure 8:
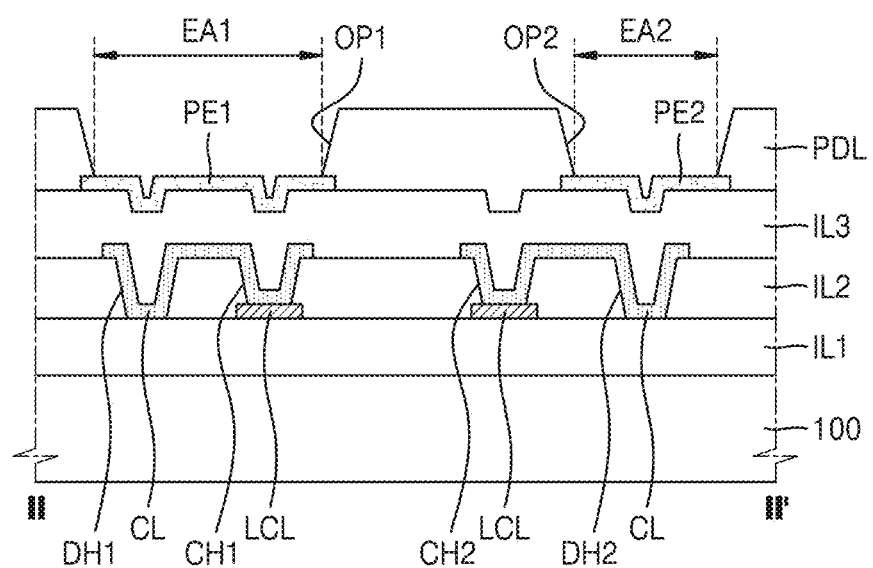
FIG. 8 is a schematic cross-sectional view of the pixel taken along line II-II' of FIG. 7.

FIG. 7 is a schematic layout diagram showing a relationship between an emission area and a conductive layer of a pixel according to an embodiment. FIG. 8 is a schematic cross-sectional view of the pixel taken along line II-II' of FIG. 7. In FIGS. 7 and 8, the same reference numerals as those of FIGS. 4 and 5 denote the same elements. Thus, detailed description of the same elements is omitted. The embodiments shown in FIGS. 7 and 8 are described focusing on differences therebetween.

Referring to FIGS. 7 and 8, contact holes CH and dummy holes DH may overlap a conductive line CL in a plan view and be arranged in a y direction along the conductive line CL.

The contact holes CH may include first contact holes CH1 and second contact holes CH2. The first contact holes CH1 may overlap first emission areas EA1 of first pixels PX1 and third emission areas EA3 of third pixels PX3 in a plan view. The second contact holes CH2 may not overlap second emission areas EA2 of second pixels PX2 in a plan view. For example, the first contact holes CH1 arranged along a first column M1 may overlap the first emission area EA1 of the first pixel PX1 and the third emission area EA3 of the third pixel PX3 in a plan view. The second contact holes CH2 arranged along a second column M2 may be arranged adjacent to the second emission area EA2 of the second pixel PX2.

The dummy holes DH may include first dummy holes DH1 and second dummy holes DH2. The first dummy holes DH1 may overlap the first emission areas EA1 of the first pixels PX1 and the third emission areas EA3 of the third pixels PX3 in a plan view. The second dummy holes DH2 may overlap the second emission areas EA2 of the second pixels PX2 in a plan view. For example, the first dummy holes DH1 arranged along the first column M1 may overlap the first emission area EA1 of the first pixel PX1 and the third emission area EA3 of the third pixel PX3 in a plan view. The second dummy holes DH2 arranged along the second column M2 may overlap the second emission area EA2 of the second pixel PX2 in a plan view.

In a plan view and a cross-sectional view, each of the first emission areas EA1 and the third emission areas EA3 may overlap the first dummy hole DH1 and the first contact hole CH1 in a plan view. In a plan view, the first dummy hole DH1 and the first contact hole CH1 may be arranged to be apart by a distance from each other in the y direction. In a plan view and a cross-sectional view, each of the second emission areas EA2 may overlap the second dummy hole DH2 in a plan view, but may not overlap the second contact hole CH2 in a plan view.

Each of the first emission area EA1 and the third emission area EA3 may be horizontally symmetrical with respect to the first contact hole CH1 and the first dummy hole DH1. For example, each of the first emission area EA1 and the third emission area EA3 may be horizontally symmetrical with respect to a virtual straight line passing through the centers of the first contact hole CH1 and the first dummy hole DH1 in the y direction. The second emission area EA2 may be symmetrical with respect to a virtual straight line passing through a center of the second dummy hole DH2 in a diagonal direction (e.g., a direction inclined from a +y direction to a +x direction), and may be symmetrical with respect to a virtual straight line passing through the center of the second dummy hole DH2 in a diagonal direction (e.g., a direction inclined from a +y direction to a −x direction).

In a plan view, in the x direction, a virtual straight line IML4 may pass through the centers of the first contact holes CH1, which respectively overlap the first emission areas EA1 and the third emission areas EA3, and the second contact holes CH2. A virtual straight line IML5 may pass through the centers of the first dummy holes DH1 respectively overlapping the first emission areas EA1 and the third emission areas EA3 in a plan view. A virtual straight line IML6 may pass through the centers of the second dummy holes DH2 respectively overlapping the centers of the second emission areas EA2 in a plan view. The virtual straight lines IML4, IML5, and IML6 may be parallel to each other with a distance from each other.

In a plan view, the first contact holes CH1 and the second contact holes CH2 may be alternately arranged with each other at a column spacing GD on a straight line in the x direction. For example, in a plan view, the first contact holes CH1 and the second contact holes CH2 may be alternately arranged with each other at the column spacing GD on the virtual straight line IML4 in the x direction.

Figure 9:
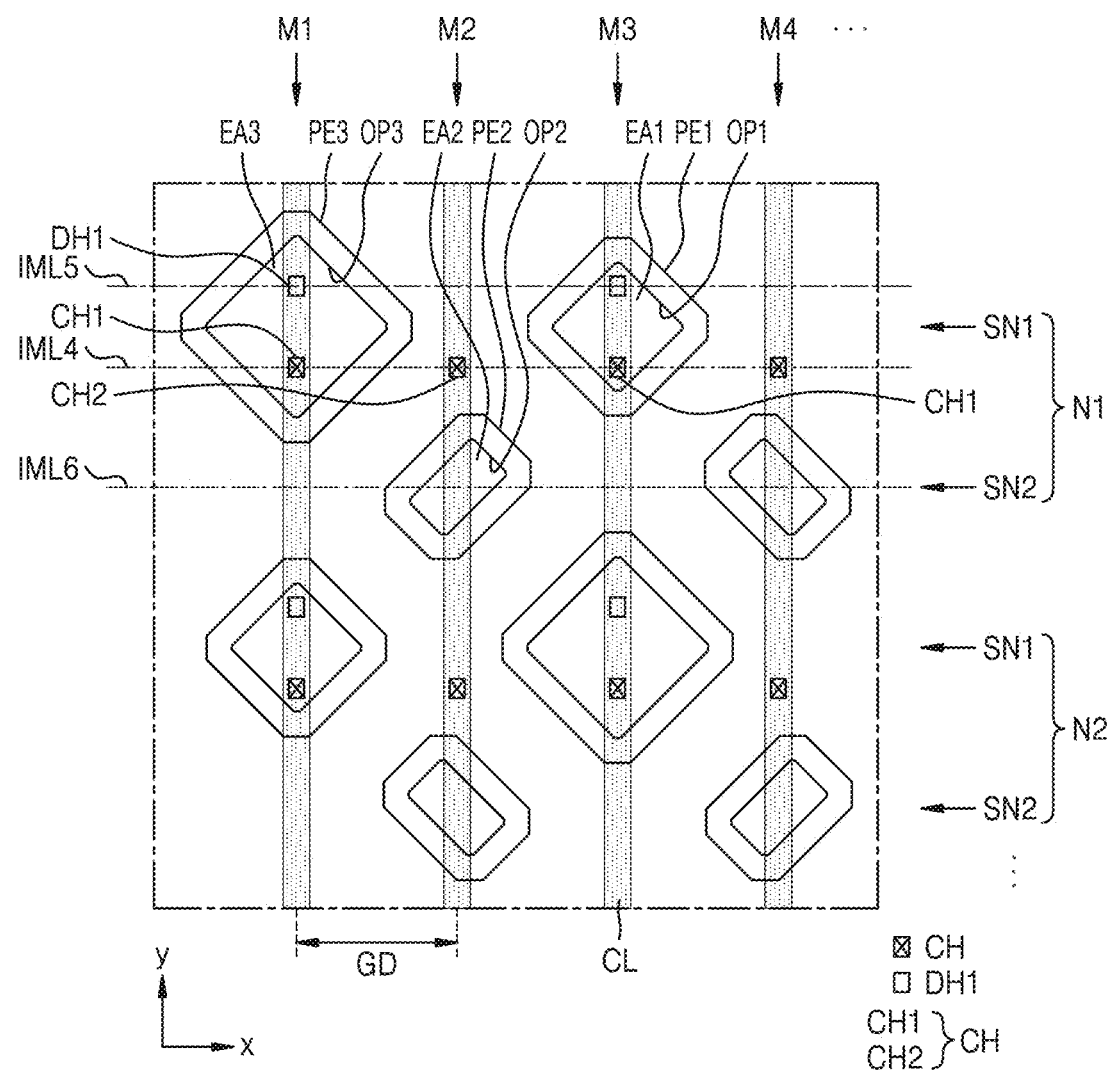
FIG. 9 is a schematic layout diagram showing a relationship between an emission area and a conductive layer of a pixel according to an embodiment.

FIG. 9 is a schematic layout diagram showing a relationship between an emission area and a conductive layer of a pixel according to an embodiment. The embodiment shown in FIG. 9 differs from the embodiment shown in FIG. 7 at least in that the dummy hole DH overlapping each of the second emission areas EA2 of the second pixels PX2 in a plan view is not provided.

Referring to FIG. 9, each of first emission areas EA1 of first pixels PX1 and third emission areas EA3 of third pixels PX3 may be arranged to overlap a first contact hole CH1 and a first dummy hole DH1 in a plan view. The dummy hole DH may not be provided in each of the second emission area EA2 of the second pixels PX2. In the display apparatus according to the embodiment shown in FIG. 9, the first emission areas EA1 and the third emission areas EA3 may have the same color shift characteristics, but color shift characteristics of the second emission area EA2 may be different from color shift characteristics of the embodiment shown in FIG. 7.

Figure 10:
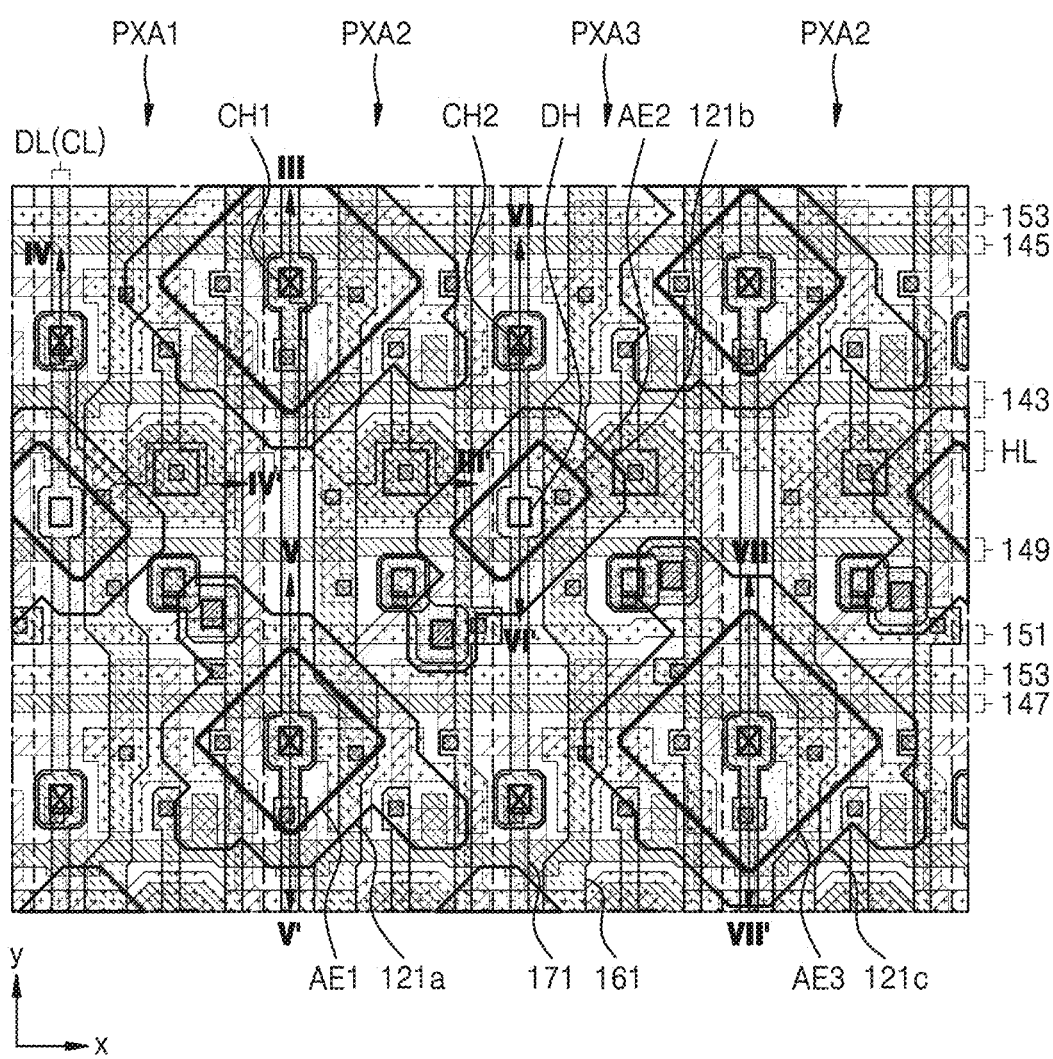
FIG. 10 is a schematic layout diagram schematically illustrating locations of elements included in a pixel according to an embodiment.
Figure 11:
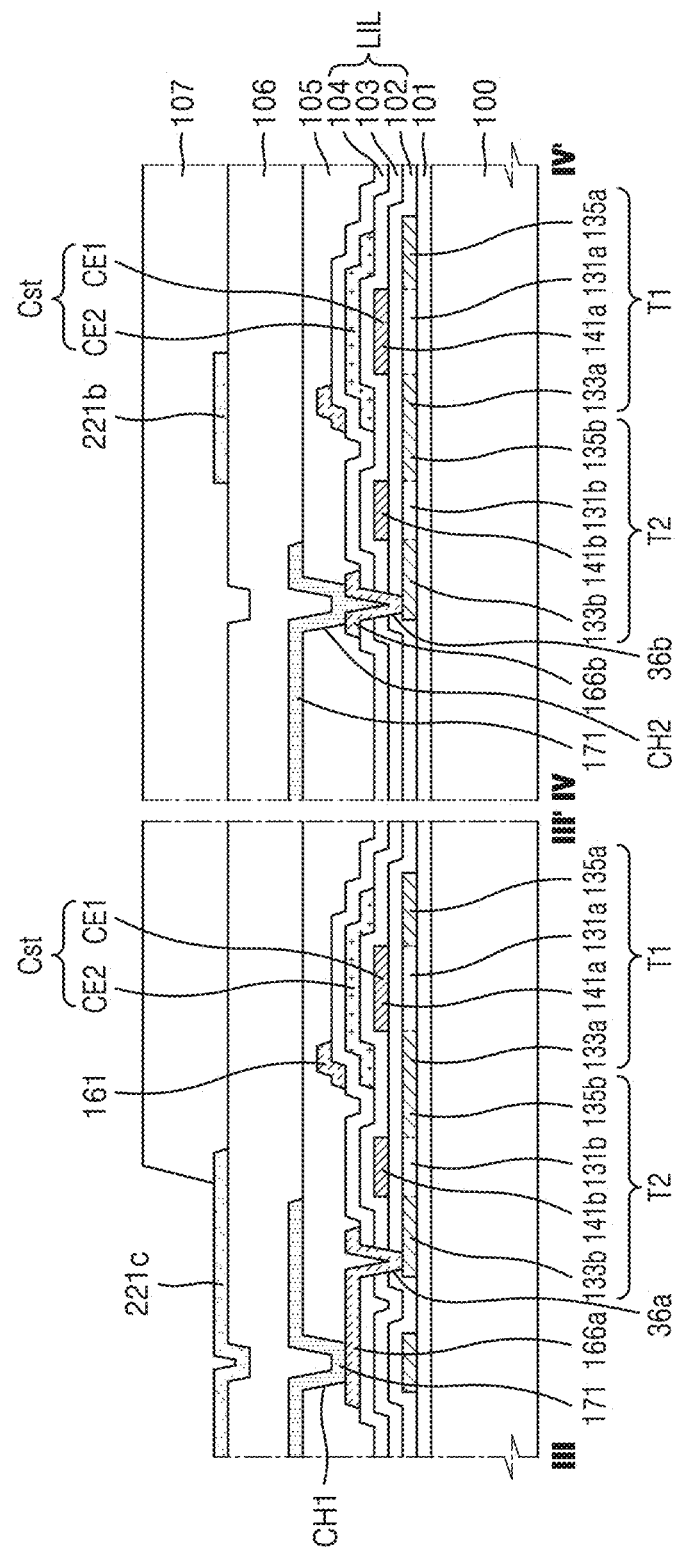
FIGS. 11 and 12 are schematic cross-sectional views of some areas of FIG. 10.
Figure 12:
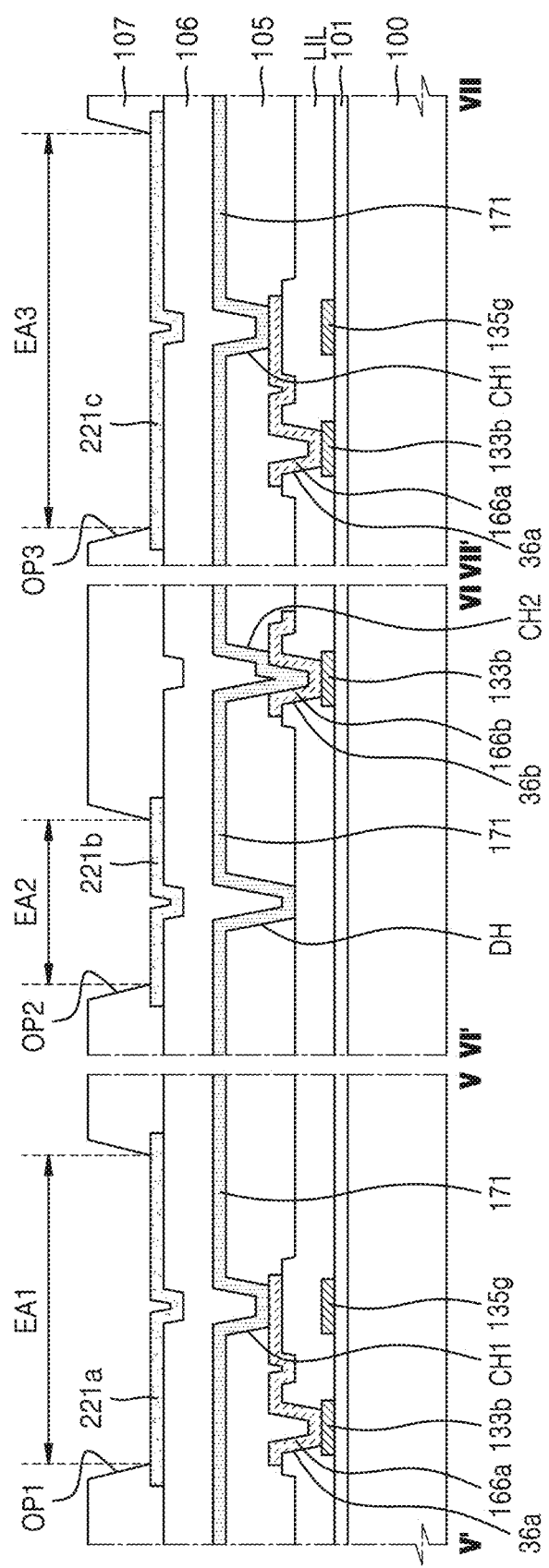

FIG. 10 is a schematic layout diagram schematically illustrating locations of elements included in a pixel according to an embodiment. FIGS. 11 and 12 are schematic cross-sectional views of some areas of FIG. 10. FIGS. 13 to 20 are schematic layout diagrams schematically illustrating the elements of FIG. 10 for each layer. FIG. 10 may correspond to a layout diagram of the pixel shown in FIG. 2. The first to seventh transistors T1 to T7 shown in FIG. 2 may be implemented as thin-film transistors. Same elements are disposed on each of layers of the first to third pixels PX1, PX2, and PX3, and thus, the elements are not separately described. FIG. 16 shows first to seventh transistors T1 to T7 and a capacitor Cst of a pixel.

Referring to FIGS. 10 to 15, in each row on the substrate 100, a first pixel area PXA1 in which a pixel circuit of the first pixel PX1 (e.g., refer to FIG. 3) is arranged, a second pixel area PXA2 in which a pixel circuit of the second pixel PX2 is arranged, and a third pixel area PXA3 in which a pixel circuit of the third pixel PX3 (e.g., refer to FIG. 3) is arranged may be repeated in the x direction at a constant (or equal) interval.

Figure 13:
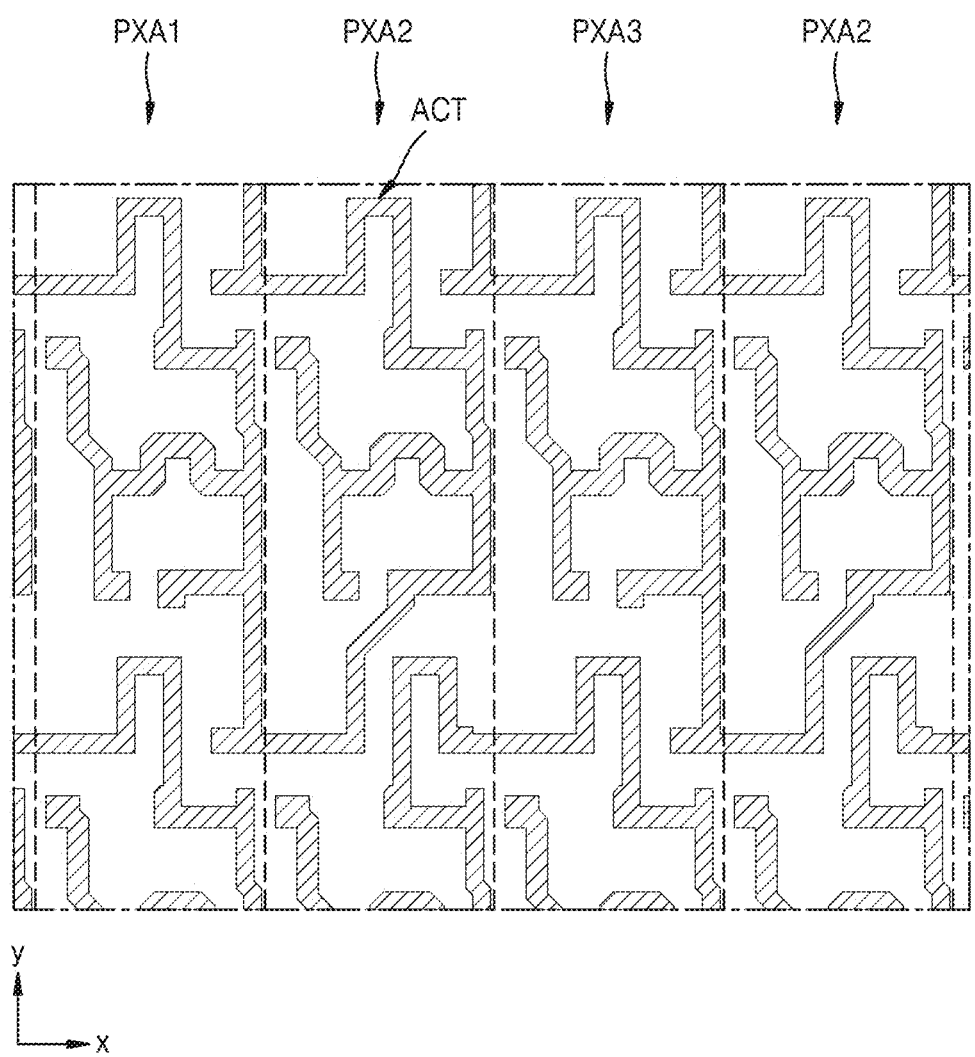
FIGS. 13 to 20 are schematic layout diagrams schematically illustrating the elements of FIG. 10 for each layer.

As shown in FIG. 13, a buffer layer 101 may be disposed on the substrate 100, and a semiconductor layer ACT may be disposed on the buffer layer 101. In each row, the semiconductor layers ACT of the first pixel area PXA1, the second pixel area PXA2, and the third pixel area PXA3 may be electrically connected to each other. In each of the pixel areas, the semiconductor layer ACT may be curved in various shapes. Each of the semiconductor layers ACT of the first to seventh transistors T1 to T7 (e.g., refer to FIG. 2) may include a channel area, a source area, and a drain area. The source area and the drain area of each of the semiconductor layers ACT of the first to seventh transistors T1 to T7 may be located at sides (e.g., opposite sides) of the channel area thereof.

Referring to FIG. 16, the semiconductor layer ACT of each of the pixel areas may include a channel area 131a, a source area 133a, and a drain area 135a of the first transistor T1, a channel area 131b, a source area 133b, and a drain area 135b of the second transistor T2, channel areas 131c1 and 131c2, a source area 133c, and a drain area 135c of the third transistor T3, channel areas 131d1 and 131d2, a source area 133d, and a drain area 135d of the fourth transistor T4, a channel area 131e, a source area 133e, and a drain area 135e of the fifth transistor T5, a channel area 131f, a source area 133f, and a drain area 135f of the sixth transistor T6, and a channel area 131g, a source area 133g, and a drain area 135g of the seventh transistor T7.

Each of the channel areas 131a, 131b, 131c1, 131c2, 131d1, 131d2, 131e, 131f, and 131g, the source areas 133a, 133b, 133c, 133d, 133e, 133f, and 133g, and the drain areas 135a, 135b, 135c, 135d, 135e, 135f, and 135g of the first to seventh transistors T1 to T7 may be understood as including some areas of the semiconductor layer ACT. For example, each of the channel areas 131a, 131b, 131c1, 131c2, 131d1, 131d2, 131e, 131f, and 131g, the source areas 133a, 133b, 133c, 133d, 133e, 133f, and 133g, and the drain areas 135a, 135b, 135c, 135d, 135e, 135f, and 135g of the first to seventh transistors T1 to T7 may be included in each of the semiconductor layers ACT. The channel area 131a of the first transistor T1 may be curved and elongated, and thus, a driving range of a gate voltage applied to a gate electrode 141a thereof may increase. A shape of the channel area 131a of the first transistor T1 may include at least one of the shapes similar to "Ω," "Ω," "S," "M," "W," and the like, and various modifications may be made.

The source area (e.g., 133a, 133b, 133c, 133d, 133e, 133f, or 133g) and the drain area (e.g., 135a, 135b, 135c, 135d, 135e, 135f, or 135g) may be understood as a source electrode and a drain electrode of a transistor (e.g., T1, T2, T3, T4, T5, T6, or T7). For example, a source electrode and a drain electrode of the first transistor T1 may respectively correspond to the source area 133a and the drain area 135a doped with impurities and disposed near the channel area 131a. A first insulating layer 102 (e.g., refer to FIG. 11) may be disposed on the semiconductor layer ACT.

Figure 14:
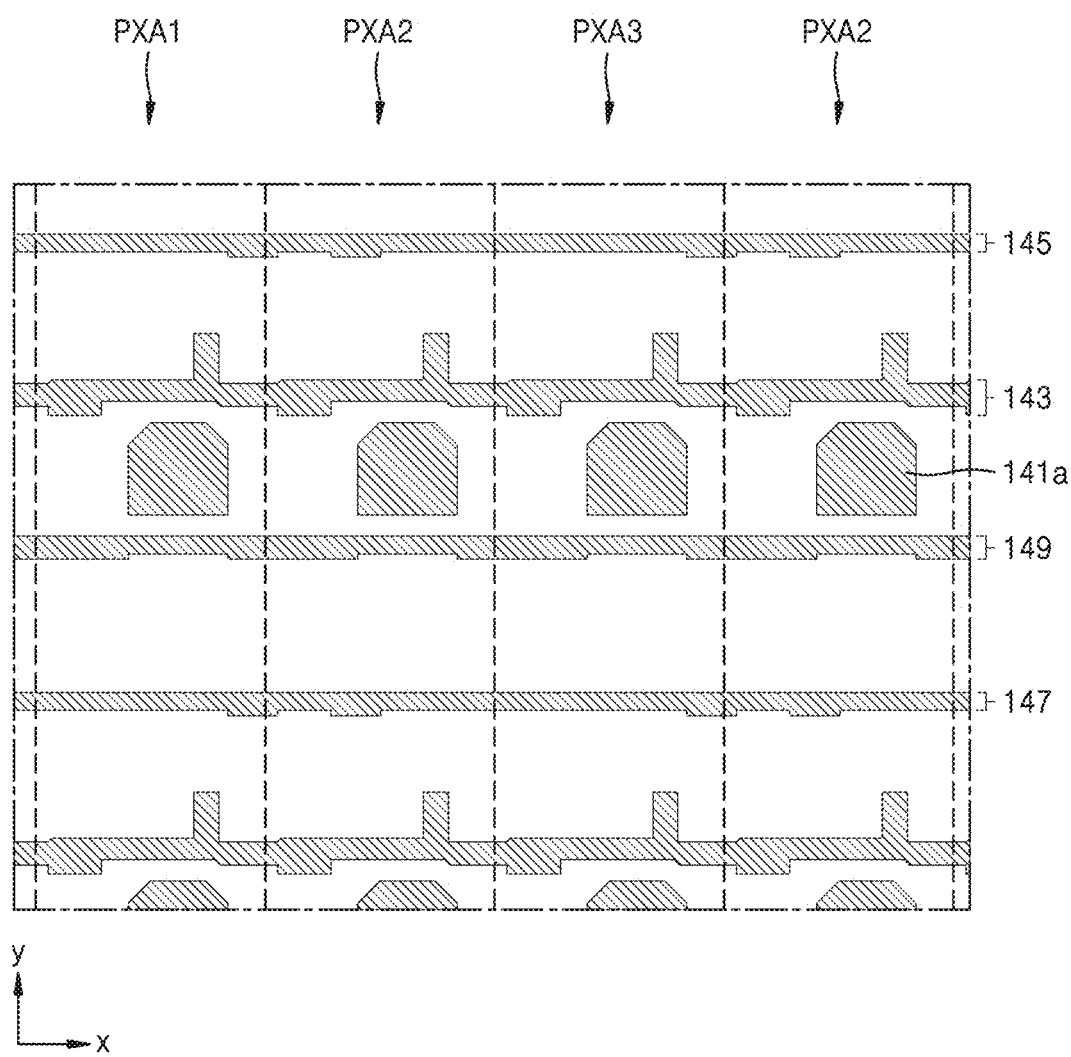

As shown in FIGS. 14 and 16, a gate electrode 141a of the first transistor T1, a gate electrode 141b of the second transistor T2, gate electrodes 141c1 and 141c2 of the third transistor T3, gate electrodes 141d1 and 141d2 of the fourth transistor T4, a gate electrode 141e of the fifth transistor T5, a gate electrode 141f of the sixth transistor T6, and a gate electrode 141g of the seventh transistor T7 may be disposed on the first insulating layer 102 (e.g., refer to FIG. 11). A first scan line 143, a second scan line 145, a third scan line 147, and an emission control line 149 may extend in the x direction over the first insulating layer 102 and be disposed on a same layer as the gate electrodes 141a, 141b, 141c1, 141c2, 141d1, 141d2, 141e, 141f, and 141g of the first to seventh transistors T1 to T7 and include a same material. The third scan line 147 may be another second scan line 145 of a next row.

The gate electrode 141b of the second transistor T2 and the gate electrodes 141c1 and 141c2 of the third transistor T3 may include (or may be) portions of the first scan line 143 crossing (or overlapping) the semiconductor layer or portions protruding from the first scan line 143. The gate electrodes 141d1 and 141d2 of the fourth transistor T4 may include (or may be) portions of the second scan line 145 crossing the semiconductor layer or portions protruding from the second scan line 145. The gate electrode 141e of the fifth transistor T5 and the gate electrode 141f of the sixth transistor T6 may be understood as including (or may be) portions of the emission control line 149 crossing the semiconductor layer or portions protruding from the emission control line 149. The gate electrode 141g of the seventh transistor T7 may include (or may be) portions of the third scan line 147 crossing the semiconductor layer in a next row or portions protruding from the third scan line 147. The gate electrode 141a of the first transistor T1 may be provided in an island type. The gate electrode 141a of the first transistor T1 may include a lower electrode CE1, which is a first electrode of the capacitor Cst. A second insulating layer 103 (e.g., refer to FIG. 11) may be disposed on the gate electrodes 141a, 141b, 141c1, 141c2, 141d1, 141d2, 141e, 141f, and 141g of the first to seventh transistors T1 to T7.

Figure 15:
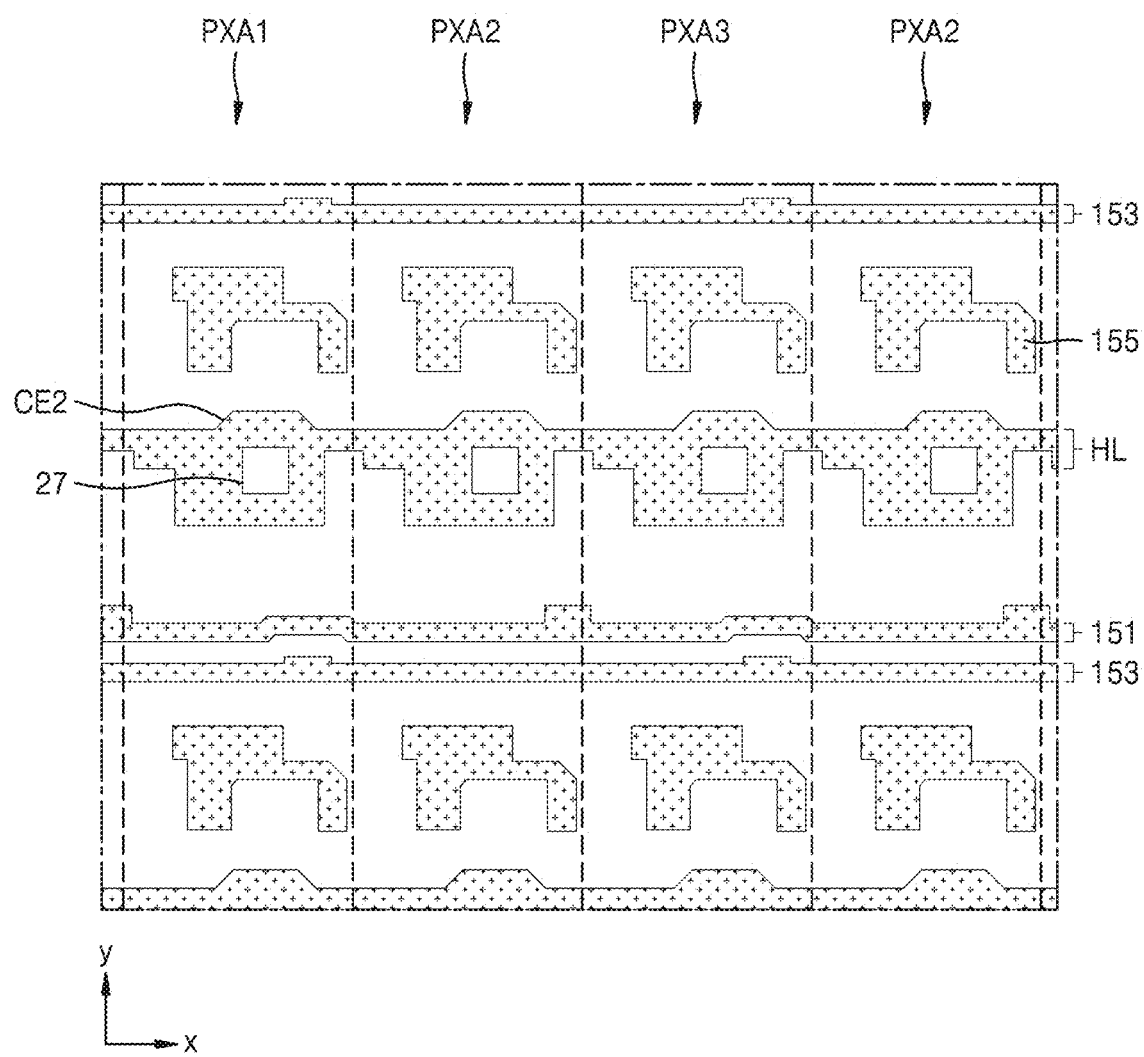
Figure 16:
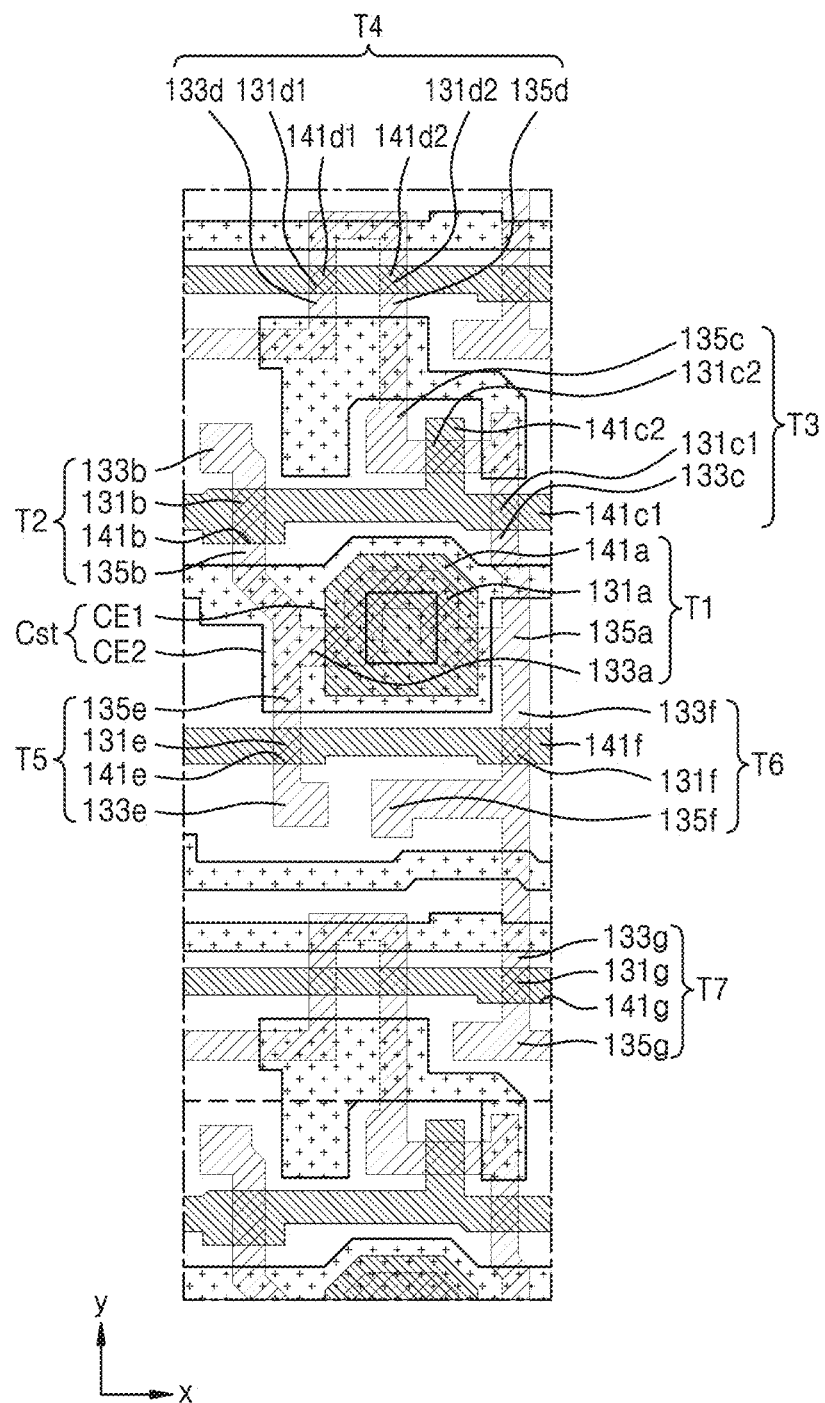

As shown in FIGS. 15 and 16, an electrode voltage line HL, a first horizontal initialization voltage line 151, and a second horizontal initialization voltage line 153 may extend in the x direction over the second insulating layer 103 (e.g., refer to FIG. 11).

A portion of the electrode voltage line HL may cover the lower electrode CE1 of the capacitor Cst. A portion of the electrode voltage line HL may be an upper electrode CE2, which is a second electrode of the capacitor Cst. The upper electrodes CE2 of the capacitors Cst of the first to third pixels PX1, PX2, and PX3 (e.g., refer to FIG. 3) may be electrically connected to each other by the electrode voltage line HL. An opening 27 may be provided in the upper electrode CE2 of the capacitor Cst.

The second horizontal initialization voltage line 153 may overlap the semiconductor layer ACT between the two channel areas 131d1 and 131d2 of the fourth transistor T4 in a plan view.

A shielding layer 155 may be further disposed on the second insulating layer 103. The shielding layer 155 may overlap the semiconductor layer ACT between the two channel areas 131c1 and 131c2 of the third transistor T3 in a plan view.

A third insulating layer 104 (e.g., refer to FIG. 11) may be disposed on the electrode voltage line HL, the first horizontal initialization voltage line 151, and the second horizontal initialization voltage line 153. The first insulating layer 102 (e.g., refer to FIG. 11), the second insulating layer 103 (e.g., refer to FIG. 11), and the third insulating layer 104 may be collectively referred to as a lower insulating layer LIL. In an embodiment, the lower insulating layer LIL may include an inorganic insulating layer.

Figure 17:
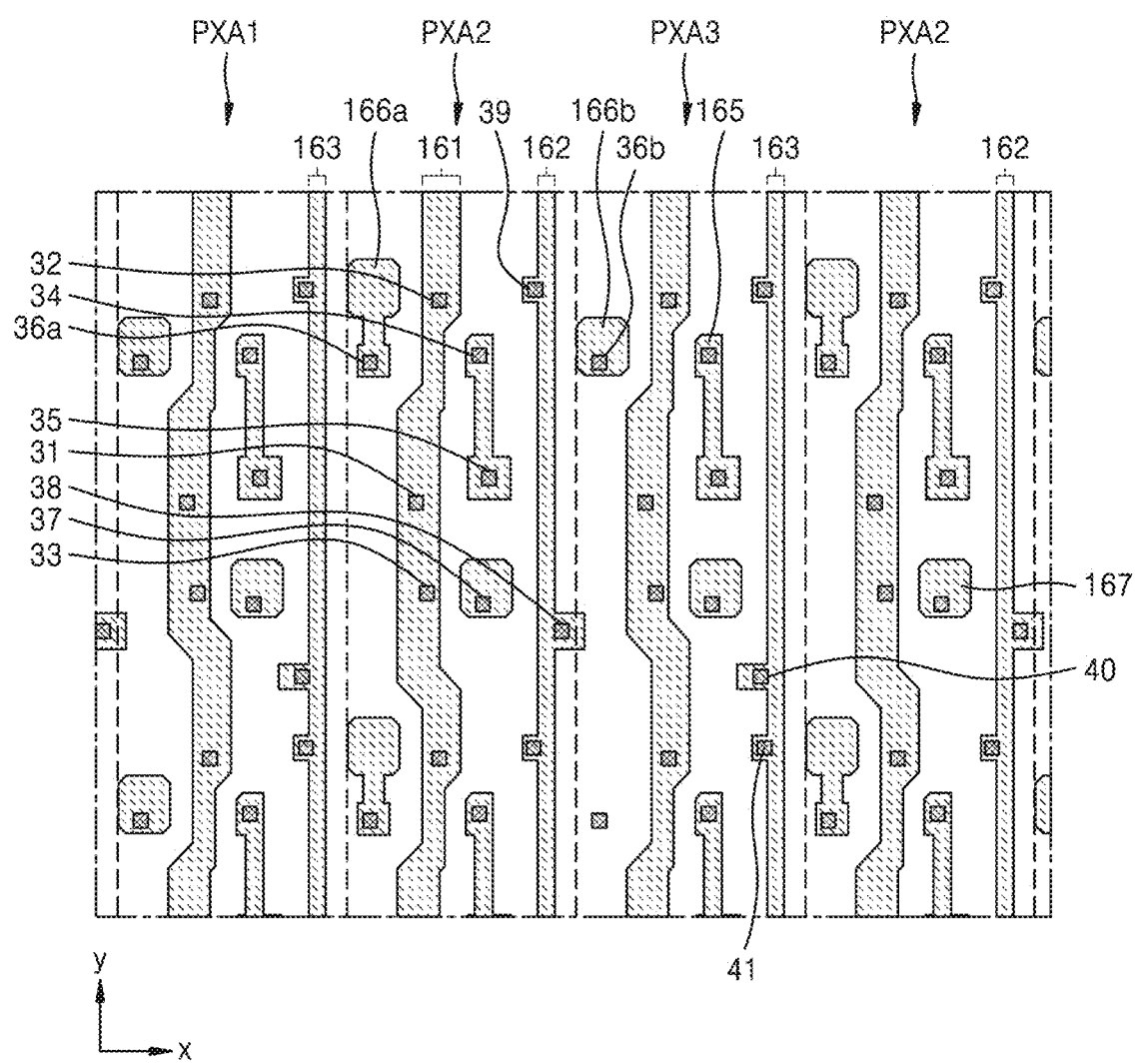

As shown in FIG. 17, a driving voltage line 161, a first vertical initialization voltage line 162, and a second vertical initialization voltage line 163 may extend in the y direction over the third insulating layer 104 (e.g., refer to FIG. 11).

The driving voltage line 161 may be electrically connected to the upper electrode CE2 (e.g., refer to FIG. 11) of the capacitor Cst (e.g., refer to FIG. 11) via a contact hole 31 provided in the third insulating layer 104 (e.g., refer to FIG. 11). The driving voltage line 161 may be electrically connected to the shielding layer 155 (e.g., refer to FIG. 15) via a contact hole 32 provided in the third insulating layer 104. The driving voltage line 161 may be electrically connected to the source area 133e (e.g., refer to FIG. 16) of the fifth transistor T5 (e.g., refer to FIG. 16) via a contact hole 33 passing through the first insulating layer 102 (e.g., refer to FIG. 11), the second insulating layer 103 (e.g., refer to FIG. 11), and the third insulating layer 104. The driving voltage line 161 extending in the y direction may be electrically connected to the electrode voltage line HL (e.g., refer to FIG. 15) extending in the x direction. Thus, the driving voltage line 161 may have a mesh structure.

The first vertical initialization voltage line 162 may be electrically connected to the first horizontal initialization voltage line 151 (e.g., refer to FIG. 15) via a contact hole 38 provided in the third insulating layer 104 (e.g., refer to FIG. 11). The first vertical initialization voltage line 162 may be electrically connected to the drain area 135d (e.g., refer to FIG. 16) of the fourth transistor T4 (e.g., refer to FIG. 16) via a contact hole 39 passing through the first insulating layer 102 (e.g., refer to FIG. 11), the second insulating layer 103 (e.g., refer to FIG. 11), and the third insulating layer 104. The first vertical initialization voltage line 162 extending in the y direction may be electrically connected to the first horizontal initialization voltage line 151 (e.g., refer to FIG. 15) extending in the x direction. Thus, the first initialization voltage line VIL1 (e.g., refer to FIG. 2) may have a mesh structure.

The second vertical initialization voltage line 163 may be electrically connected to the second horizontal initialization voltage line 153 (e.g., refer to FIG. 15) via a contact hole 40 provided in the third insulating layer 104 (e.g., refer to FIG. 11). The second vertical initialization voltage line 163 may be electrically connected to the drain area 135g (e.g., refer to FIG. 16) of the seventh transistor T7 (e.g., refer to FIG. 16) via a contact hole 41 passing through the first insulating layer 102 (e.g., refer to FIG. 11), the second insulating layer 103 (e.g., refer to FIG. 11), and the third insulating layer 104. The second vertical initialization voltage line 163 extending in the y direction may be electrically connected to the second horizontal initialization voltage line 153 (e.g., refer to FIG. 15) extending in the x direction. Thus, the second initialization voltage line VIL2 (e.g., refer to FIG. 2) may have a mesh structure.

The driving voltage line 161 may be arranged for each pixel area. The first vertical initialization voltage line 162 or the second vertical initialization voltage line 163 may be arranged in a pixel area. The first vertical initialization voltage line 162 and the second vertical initialization voltage line 163 may be arranged for every other pixel area, and may be alternately arranged with each other in the x direction.

Various conductive layers may be further disposed on the third insulating layer 104 (e.g., refer to FIG. 11). For example, a node electrode 165 and connection electrodes 166a, 166b, and 167 may be provided over the third insulating layer 104.

The node electrode 165 may allow the lower electrode CE1 (e.g., refer to FIG. 11) of the capacitor Cst (e.g., refer to FIG. 11) and the drain area 135c (e.g., refer to FIG. 16) of the third transistor T3 (e.g., refer to FIG. 16) to be electrically connected to each other via the opening 27 (e.g., refer to FIG. 15) of the upper electrode CE2 (e.g., refer to FIG. 11) of the capacitor Cst. An end of the node electrode 165 may be electrically connected to the drain area 135c (e.g., refer to FIG. 16) of the third transistor T3 (e.g., refer to FIG. 16) and the drain area 135d (e.g., refer to FIG. 16) of the fourth transistor T4 (e.g., refer to FIG. 16) via a contact hole 34 (e.g., refer to FIG. 15) passing through the first insulating layer 102 (e.g., refer to FIG. 11), the second insulating layer 103, and the third insulating layer 104, and another end of the node electrode 165 may be electrically connected to the gate electrode 141a (e.g., refer to FIG. 16) of the first transistor T1 (e.g., refer to FIG. 16) via a contact hole 35 (e.g., refer to FIG. 15) passing through the second insulating layer 103 (e.g., refer to FIG. 11) and the third insulating layer 104.

The connection electrode 166a arranged in the second pixel area PXA2 may be electrically connected to the source area 133b (e.g., refer to FIG. 16) of the second transistor T2 (e.g., refer to FIG. 16) via a contact hole 36a passing through the first insulating layer 102 (e.g., refer to FIG. 11), the second insulating layer 103 (e.g., refer to FIG. 11), and the third insulating layer 104 (e.g., refer to FIG. 11). The connection electrode 166b arranged in the first pixel area PXA1 and the third pixel area PXA3 may be electrically connected to the source area 133b (e.g., refer to FIG. 16) of the second transistor T2 (e.g., refer to FIG. 16) via a contact hole 36b passing through the first insulating layer 102, the second insulating layer 103, and the third insulating layer 104. The connection electrode 167 may be electrically connected to the drain area 135f (e.g., refer to FIG. 16) of the sixth transistor T6 (e.g., refer to FIG. 16) via a contact hole 37 passing through the first insulating layer 102, the second insulating layer 103, and the third insulating layer 104. The connection electrode 166a arranged in the second pixel area PXA2 and the connection electrode 166b arranged in the first pixel area PXA1 and the third pixel area PXA3 may have different sizes from each other. For example, a length of the connection electrode 166a in they direction may be greater than that of the connection electrode 166b in the y direction.

A fourth insulating layer 105 (e.g., refer to FIG. 11) may be disposed on the driving voltage line 161, the first vertical initialization voltage line 162, the second vertical initialization voltage line 163, the node electrode 165, and the connection electrodes 166a, 166b, and 167.

Figure 18:
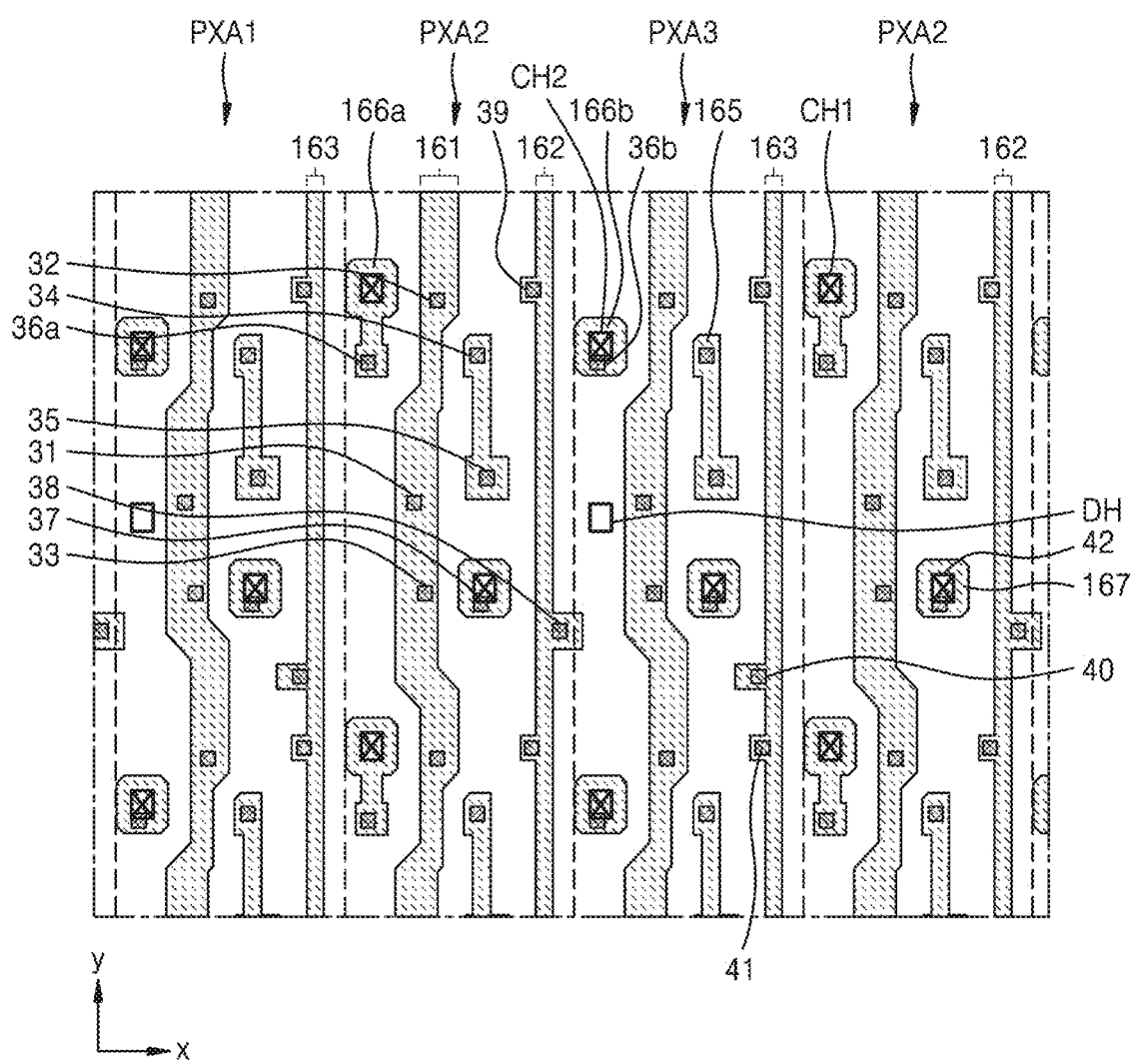

As shown in FIG. 18, holes exposing a portion of the connection electrodes 166a, 166b, and 167 may be defined in the fourth insulating layer 105 (e.g., refer to FIG. 11). The holes corresponding to the connection electrodes 166a and 166b may be the first contact holes CH1 and the second contact holes CH2. For example, the first contact hole CH1 corresponding to the connection electrode 166a may be arranged in the second pixel area PXA2, and may be provided in the fourth insulating layer 105 (e.g., refer to FIG. 11). The second contact hole CH2 corresponding to the connection electrode 166b may be arranged in the first pixel area PXA1 and the third pixel area PXA3, and may be provided in the fourth insulating layer 105. A contact hole 42 corresponding to the connection electrode 167 may be arranged in the first pixel area PXA1, the second pixel area PXA2, and the third pixel area PXA3, and may be provided in the fourth insulating layer 105.

The dummy hole DH shown in FIG. 4 may be further provided in the fourth insulating layer 105 (e.g., refer to FIG. 11). The dummy hole DH may be provided in the fourth insulating layer 105 of the first pixel area PXA1 and the third pixel area PXA3.

Figure 19:
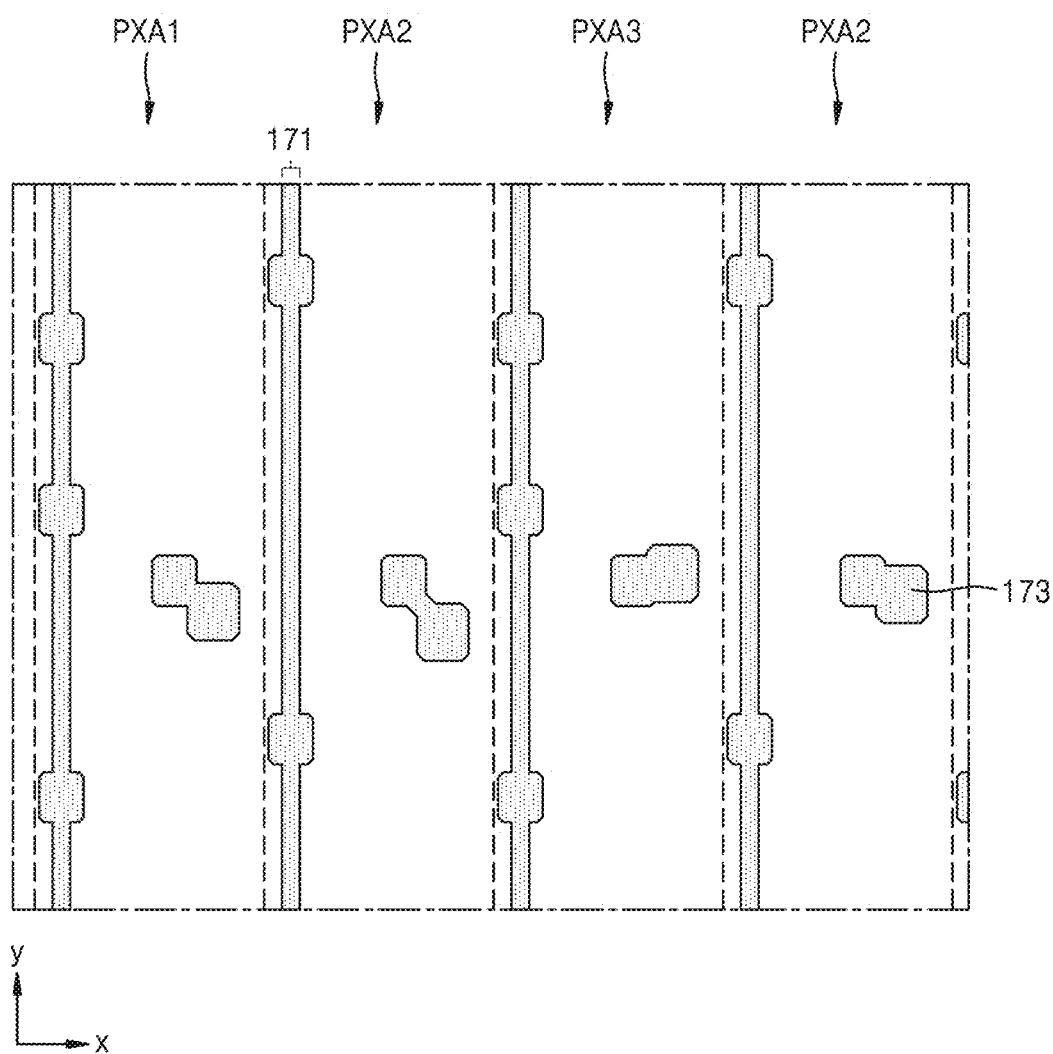

As shown in FIG. 19, a data line 171 and a connection electrode 173 may be disposed on the fourth insulating layer 105 (e.g., refer to FIG. 11).

The data line 171 may extend in the y direction. The data line 171 arranged in the first pixel area PXA1 and the third pixel area PXA3 may be electrically connected to the source area 133b (e.g., refer to FIG. 16) of the second transistor T2 (e.g., refer to FIG. 16), and may be electrically connected to the connection electrode 166b via the second contact hole CH2 (e.g., refer to FIG. 18) provided in the fourth insulating layer 105 (e.g., refer to FIG. 11). The data line 171 arranged in the second pixel area PXA2 may be electrically connected to the source area 133b (e.g., refer to FIG. 16) of the second transistor T2 (e.g., refer to FIG. 16) by being electrically connected to the connection electrode 166a (e.g., refer to FIG. 18) via the first contact hole CH1 (e.g., refer to FIG. 18) provided in the fourth insulating layer 105. In an embodiment, the conductive line CL and lower conductive line LCL of FIG. 4 may be the data line 171 and the connection electrodes 166a and 166b (e.g., refer to FIG. 18), respectively.

The connection electrode 173 may include an electrode for connecting the organic light-emitting diode OLED (e.g., refer to FIG. 2) to a transistor. The connection electrode 173 may include an electrode for connecting each of the first to third pixel electrodes 221a, 221b, and 221c to a source area or drain area of the transistor. The connection electrode 173 may be electrically connected to the drain area 135f (e.g., refer to FIG. 16) of the sixth transistor T6 (e.g., refer to FIG. 16) and the source area 133g (e.g., refer to FIG. 16) of the seventh transistor T7 (e.g., refer to FIG. 16), and may be electrically connected to the connection electrode 167 (e.g., refer to FIG. 17) via the contact hole 42 (e.g., refer to FIG. 18) provided in the fourth insulating layer 105 (e.g., refer to FIG. 11).

A fifth insulating layer 106 (e.g., refer to FIG. 11) may be disposed on the data line 171 and the connection electrode 173.

The organic light-emitting diode OLED (e.g., refer to FIG. 2) may be disposed on the fifth insulating layer 106 (e.g., refer to FIG. 11). The organic light-emitting diode OLED may include a pixel electrode, an opposite electrode, and an intermediate layer between the pixel electrode and the opposite electrode.

Figure 20:
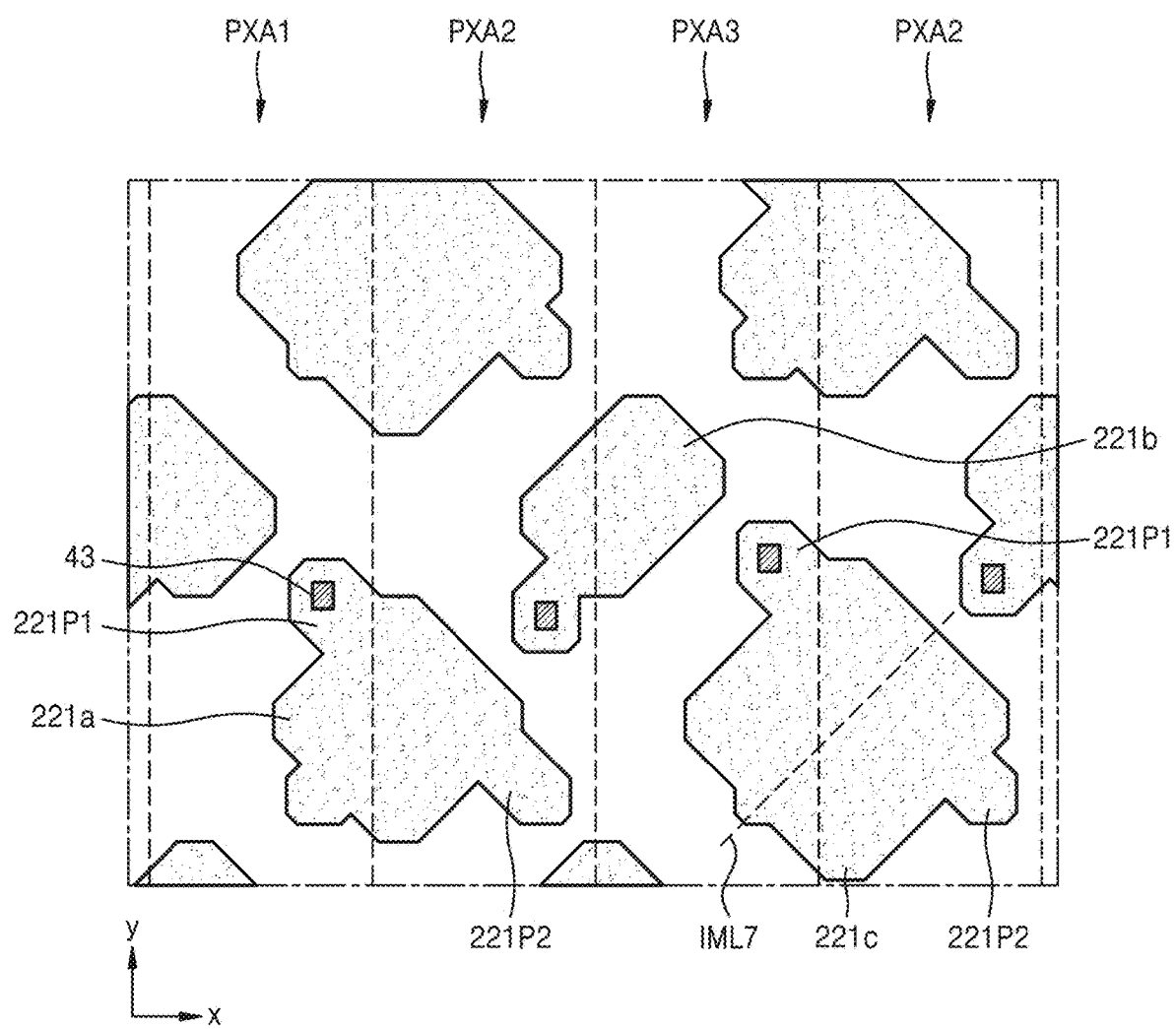

As shown in FIG. 20, the first to third pixel electrodes 221a, 221b, and 221c may be disposed on the fifth insulating layer 106 (e.g., refer to FIG. 11). The first pixel electrode 221a and the third pixel electrode 221c may be electrically connected to the connection electrode 173 (e.g., refer to FIG. 19) via a contact hole 43 provided in the fifth insulating layer 106. First protrusion portions 221P1 of the first pixel electrode 221a and the third pixel electrode 221c may overlap the contact hole 43 in a plan view, and be electrically connected to the connection electrode 173 (e.g., refer to FIG. 19). The first pixel electrode 221a and the third pixel electrode 221c may have second protrusion portions 221P2 that are symmetrical to the first protrusion portions 221P1 with respect to a virtual straight line IML7 in a diagonal direction. The second protrusion portion 221P2 may partially overlap in a plan view the semiconductor layer ACT (e.g., refer to FIG. 13) between the two channel areas 131c1 and 131c2 (e.g., refer to FIG. 16) of the third transistor T3 (e.g., refer to FIG. 16) arranged in an adjacent pixel area (e.g., a pixel area of a next row or a previous row).

The first pixel electrode 221a and the third pixel electrode 221c may overlap in a plan view a portion of the source area 133b (e.g., refer to FIG. 16) of the second transistor T2 (e.g., refer to FIG. 16), a contact hole 36a (e.g., refer to FIG. 18), the connection electrode 166a (e.g., refer to FIG. 18), the first contact hole CH1 (e.g., refer to FIG. 18), and a portion of the data line 171 (e.g., refer to FIG. 19), which are arranged in an adjacent pixel area (e.g., a pixel area of a next row or a previous row). The first pixel electrode 221a and the third pixel electrode 221c may overlap in a plan view a portion of a pixel area in which a pixel circuit to which the first pixel electrode 221a or the third pixel electrode 221c are electrically connected is arranged, and a portion of a pixel area of another row or another column adjacent in the x direction and the y direction. The second pixel electrode 221b may overlap the dummy hole DH (e.g., refer to FIG. 18) and a portion of the data line 171 (e.g., refer to FIG. 19) in a plan view. The second pixel electrode 221b may overlap in a plan view a portion of a pixel area in which a pixel circuit electrically connected to the second pixel electrode 221b is arranged, and a portion of a pixel area of another column of a same row adjacent in the x direction.

As shown in FIGS. 11 and 12, a pixel-defining layer 107 covering edges of the first to third pixel electrodes 221a, 221b, and 221c (e.g., refer to FIG. 20) may be disposed on the first to third pixel electrodes 221a, 221b, and 221c. A first opening OP1 exposing a portion of the first pixel electrode 221a and defining the first emission area EA1, a second opening OP2 exposing a portion of the second pixel electrode 221b and defining the second emission area EA2, and a third opening OP3 exposing a portion of the third pixel electrode 221c and defining the third emission area EA3 may be defined in the pixel-defining layer 107.

The first opening OP1 and the third opening OP3 may overlap a portion of the source area 133b of the second transistor T2, the contact hole 36a, the connection electrode 166a, the first contact hole CH1, and a portion of the data line 171 in a plan view. The first emission area EA1 and the third emission area EA3 may overlap the portion of the source area 133b of the second transistor T2, the contact hole 36a, the connection electrode 166a, the first contact hole CH1, and the portion of the data line 171 in a plan view.

The second opening OP2 may be offset from a portion of the source area 133b of the second transistor T2, the contact hole 36b, the connection electrode 166b, and the second contact hole CH2, and may overlap the dummy hole DH. The second emission area EA2 may be offset from the portion of the source area 133b of the second transistor T2, the contact hole 36b, the connection electrode 166b, and the second contact hole CH2 and overlaps the dummy hole DH.

Although not shown, an emission layer may be arranged in each of the first to third openings OP1, OP2, and OP3, and an opposite electrode may be disposed on a front surface of the substrate 100 as a common electrode over the emission layer.

Figure 21:
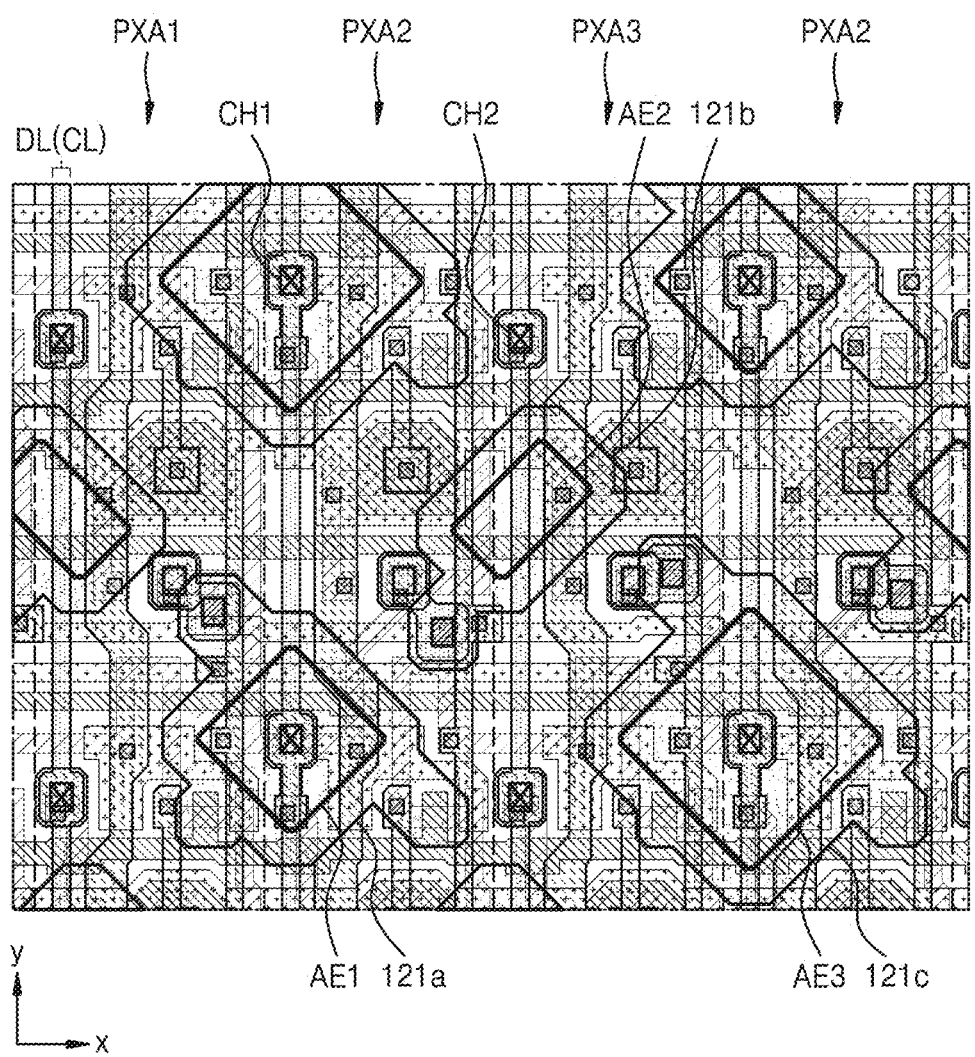
FIGS. 21 to 23 are schematic layout diagrams schematically illustrating locations of elements included in a pixel according to an embodiment.
Figure 22:
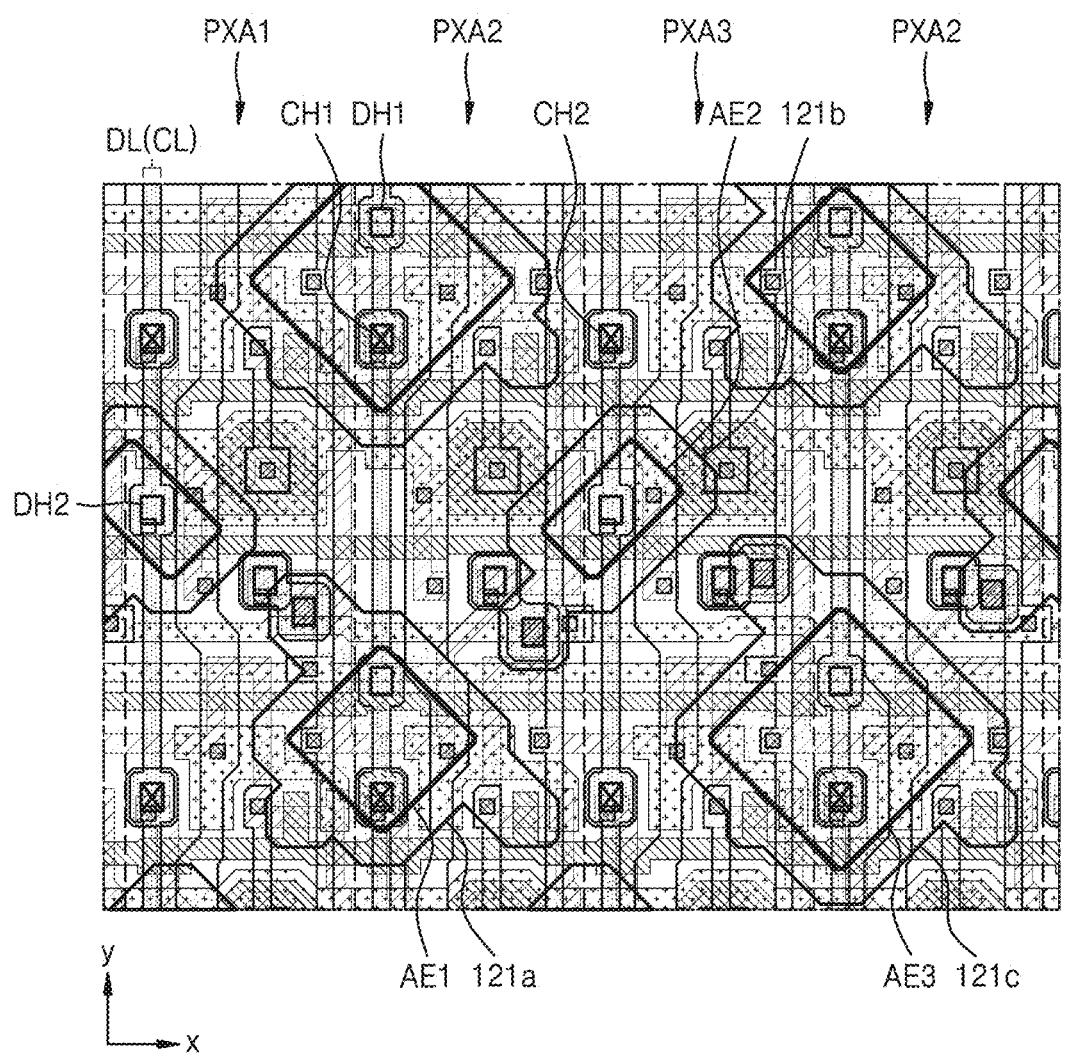
Figure 23:
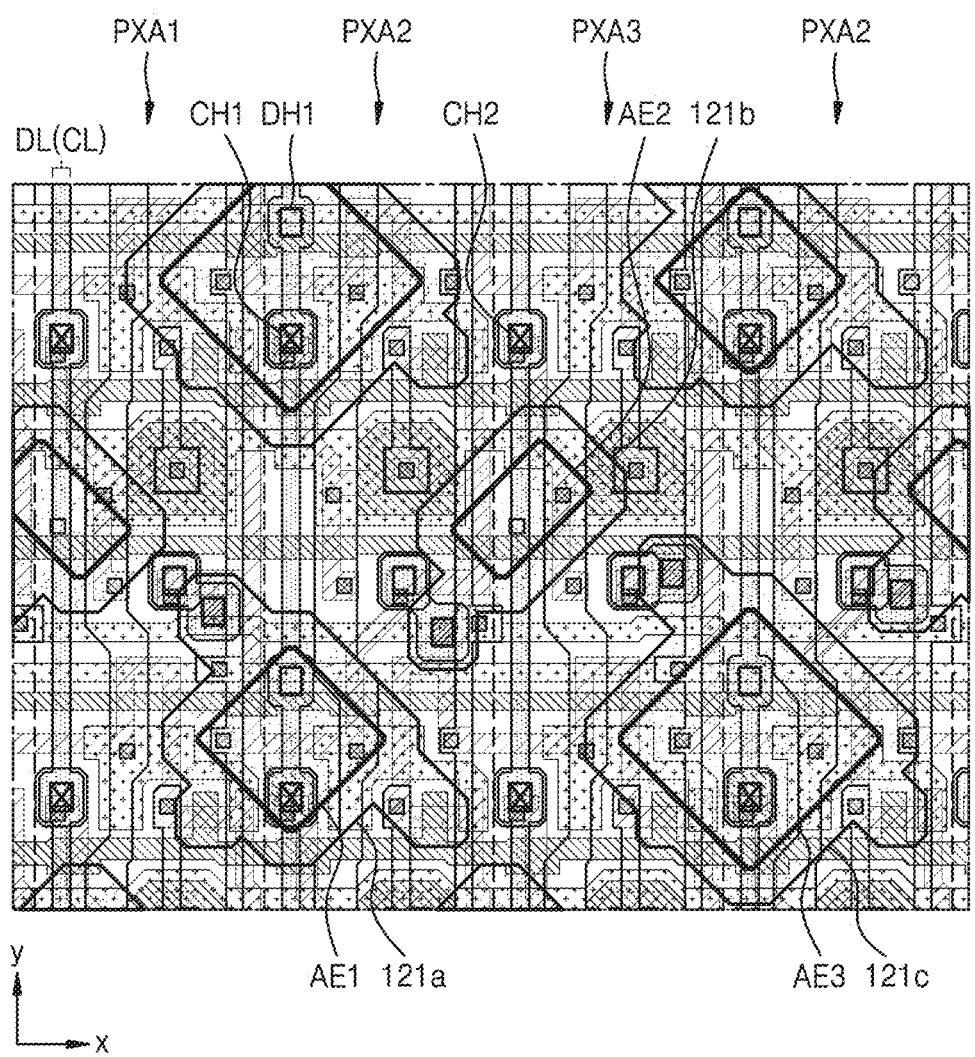

FIGS. 21 to 23 are schematic layout diagrams schematically illustrating locations of elements included in a pixel according to an embodiment.

The embodiment shown in FIG. 21 may correspond to the embodiment shown in FIG. 6. The embodiment shown in FIG. 21 is different from the embodiment shown in FIG. 10 at least in that the dummy hole DH corresponding to the second pixel electrodes 221b (e.g., refer to FIG. 12) or second emission areas EA2 (e.g., refer to FIG. 3) of the second pixels PX2 (e.g., refer to FIG. 3) is not arranged.

The embodiment shown in FIG. 22 may correspond to the embodiment shown in FIG. 7. Each of the first pixel electrodes 221a (e.g., refer to FIG. 12) of the first pixels PX1 (e.g., refer to FIG. 3) and the third pixel electrodes 221c (e.g., refer to FIG. 12) of the third pixels PX3 (e.g., refer to FIG. 12) may overlap the first dummy hole DH1 and the first contact hole CH1 in a plan view. Each of the first emission area EA1 and the third emission area EA3 may overlap the first contact hole CH1 and the first dummy hole DH1 in a plan view. The first dummy hole DH1 and the first contact hole CH1 may be apart from each other by a distance in the y direction.

Each of the second pixel electrodes 221b (e.g., refer to FIG. 12) and second emission areas EA2 of the second pixels PX2 (e.g., refer to FIG. 3) may overlap the second dummy hole DH2 in a plan view.

In a plan view, in the x direction, a virtual straight line IML4 may pass through the centers of the first contact holes CH1 and the second contact holes CH2 respectively overlapping the first emission areas EA1 and the third emission areas EA3 in a plan view. A virtual straight line IML5 may pass through the centers of the first dummy holes DH1 respectively overlapping the first emission areas EA1 and the third emission areas EA3 in a plan view. A virtual straight line IML6 may pass through the centers of the second dummy holes DH2 respectively overlapping the centers of the second emission areas EA2 in a plan view. The virtual straight line IML4 passing through the centers of the first contact holes CH1 and the second contact holes CH2, the virtual straight line UML5 passing through the centers of the first dummy holes DH1, and the virtual straight line IML6 passing through the centers of the second dummy holes DH2 may be parallel to scan lines with a distance (e.g., constant distance) from each other. In a plan view, in the x direction, the first contact holes CH1 and the second contact holes CH2 may be alternately arranged with each other on a straight line with a column spacing GD.

The embodiment shown in FIG. 23 may correspond to the embodiment shown in FIG. 9. The first contact hole CH1 may be arranged at a center of each of the first pixel electrodes 221a (e.g., refer to FIG. 12) of the first pixels PX1 (e.g., refer to FIG. 3) and the third pixel electrodes 221c (e.g., refer to FIG. 12) of the third pixels PX3 (e.g., refer to FIG. 3). The embodiment shown in FIG. 23 differs from the embodiment shown in FIG. 22 at least in that the dummy hole DH is not arranged in each of the second pixel electrodes 221b (e.g., refer to FIG. 12) of the second pixels PX2 (e.g., refer to FIG. 3).

According to the various embodiments, the asymmetrical color shift phenomenon according to a viewing angle of a display apparatus may be minimized while maintaining uniformity between pixels. However, the scope of the disclosure is not limited by this effect.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display apparatus comprising:
   a first conductive layer arranged in a first pixel area;
   a second conductive layer arranged in a second pixel area that is adjacent to the first pixel area, wherein the first and second conductive layers are disposed at a same level in a stacked structure;
   a first conductive line arranged in the first pixel area and extending in a first direction;
   a second conductive line arranged in the second pixel area and extending in the first direction, wherein the first and second conductive lines are disposed at a same level in a stacked structure;
   a first pixel electrode in which a first emission area is defined;
   a second pixel electrode in which a second emission area is defined; and
   a first insulating layer disposed between the first conductive layer and the first conductive line and between the second conductive layer and the second conductive line, wherein
   a first hole and a second hole are defined in the first insulating layer,
   the first conductive layer and the first conductive line electrically contact each other in the first hole,
   the second conductive layer and the second conductive line electrically contact each other in the second hole,
   the first emission area overlaps the first hole in a plan view, and
   the second emission area does not overlap the second hole in a plan view.

2. The display apparatus of claim 1, wherein the first hole is located at a center of the first emission area.

3. The display apparatus of claim 1, wherein
   a dummy hole that is spaced apart from the second hole is further defined in the first insulating layer, and
   the second emission area overlaps the dummy hole in a plan view.

4. The display apparatus of claim 3, wherein the dummy hole is located at a center of the second emission area.

5. The display apparatus of claim 1, wherein the first hole and the second hole is arranged in a zigzag in a second direction perpendicular to the first direction.

6. The display apparatus of claim 1, further comprising:
   a first semiconductor layer arranged in the first pixel area;
   a second semiconductor layer arranged in the second pixel area; and
   a second insulating layer which is arranged between the first semiconductor layer and the first conductive layer and between the second semiconductor layer and the second conductive layer and is arranged under the first insulating layer, wherein
   a third hole and a fourth hole are defined in the second insulating layer,
   the first semiconductor layer and the first conductive layer electrically contact each other in the third hole,
   the second semiconductor layer and the second conductive layer electrically contact each other in the fourth hole, the third hole does not overlap the first hole in a plan view, and the fourth hole overlaps the second hole in a plan view.

7. The display apparatus of claim 6, wherein
the first emission area overlaps the third hole in a plan view, and
the second emission area does not overlap the fourth hole in a plan view.

8. The display apparatus of claim 1, wherein
a first dummy hole that is spaced apart from the first hole is further defined in the first insulating layer,
the first hole and the first dummy hole are symmetrical to each other in the first direction with respect to a center of the first emission area, and
the first hole and the first dummy hole overlap the first emission area in a plan view.

9. The display apparatus of claim 8, wherein a center of the first hole and a center of the second hole are located on a virtual straight line in a second direction perpendicular to the first direction.

10. The display apparatus of claim 8, wherein
a second dummy hole that is spaced apart from the second hole is further defined in the first insulating layer, and
the second dummy hole is located at a center of the second emission area.

11. An electronic apparatus, comprising:
a display apparatus comprising:
a first conductive layer arranged in a first pixel area;
a second conductive layer arranged in a second pixel area that is adjacent to the first pixel area, wherein the first and second conductive layers are disposed at a same level in a stacked structure;
a first conductive line disposed on the first conductive layer of the first pixel area;
a second conductive line disposed on the second conductive layer of the second pixel area;
a first pixel electrode disposed on the first conductive line;
a second pixel electrode disposed on the second conductive line; and
a pixel-defining layer which covers an edge of the first pixel electrode and the second pixel electrode and in which a first opening and a second opening area defined, wherein
the first opening corresponds to a portion of the first pixel electrode,
the second opening corresponds to a portion of the second pixel electrode,
the first opening overlaps in a plan view a location at which the first conductive layer and the first conductive line electrically contact each other, and
the second opening does not overlap in a plan view a location at which the second conductive layer and the second conductive line electrically contact each other.

12. The electronic apparatus of claim 11, further comprising:
a first insulating layer disposed between the first conductive layer and the first conductive line and between the second conductive layer and the second conductive line, wherein
a first hole and a second hole are defined in the first insulating layer in which the first conductive layer and the first conductive line electrically contact each other in the first hole,
the second conductive layer and the second conductive line electrically contact each other in the second hole,
the first hole is located at a center of the first opening, and
the second hole is located adjacent to the second pixel electrode.

13. The electronic apparatus of claim 12, wherein
a dummy hole that is spaced apart from the second hole is further defined in the first insulating layer, and
the dummy hole overlaps a center of the second opening in a plan view.

14. The electronic apparatus of claim 13, wherein the dummy hole is located at the center of the second opening.

15. The electronic apparatus of claim 12, wherein the first hole and the second hole are arranged in a zigzag in a direction perpendicular to a direction in which the first conductive line extends.

16. The electronic apparatus of claim 11, further comprising:
a first insulating layer disposed between the first conductive layer and the first conductive line and between the second conductive layer and the second conductive line, wherein
a first hole, a second hole, and a first dummy hole are defined in the first insulating layer,
the first conductive layer and the first conductive line electrically contact each other in the first hole,
the second conductive layer and the second conductive line electrically contact each other in the second hole,
the first dummy hole is spaced apart from the first hole,
the first hole and the first dummy hole are symmetrical to each other in a direction in which the first conductive line extends with respect to a center of the first opening, and
the first hole and the first dummy hole overlap the first opening in a plan view.

17. The electronic apparatus of claim 16, wherein centers of the first hole and the second hole are located on a virtual straight line in a direction perpendicular to the extension direction of the first conductive line.

18. The electronic apparatus of claim 16, wherein
a second dummy hole that is spaced apart from the second hole is further defined in the first insulating layer, and
the second dummy hole is located at a center of the second opening.

19. The electronic apparatus of claim 11, further comprising:
a first semiconductor layer arranged in the first pixel area;
a second conductive layer arranged in the second pixel area;
a first insulating layer disposed between the first conductive layer and the first conductive line and between the second conductive layer and the second conductive line; and
a second insulating layer which is arranged between the first semiconductor layer and the first conductive layer and between the second semiconductor layer and the second conductive layer, and arranged under the first insulating layer, wherein
a first hole and a second hole are defined in the first insulating layer,
the first conductive layer and the first conductive line electrically contact each other in the first hole,
the second conductive layer and the second conductive line electrically contact each other in the second hole,
a third hole and a fourth hole are defined in the second insulating layer in which the first semiconductor layer and the first conductive layer electrically contact each other in the third hole, the second semiconductor layer and the second conductive layer electrically contact each other in the fourth hole, the third hole does not overlap the first hole in a plan view, and the fourth hole overlaps the second hole in a plan view.

20. The electronic apparatus of claim 19, wherein the first opening overlaps the first hole and the third hole in a plan view, and the second opening does not overlap the second hole and the fourth hole in a plan view.

\* \* \* \* \*